United States Patent
Tanady et al.

(10) Patent No.: US 12,092,952 B2
(45) Date of Patent: Sep. 17, 2024

(54) METHODS FOR FORMING EXTREME ULTRAVIOLET MASK COMPRISING MAGNETIC MATERIAL

(71) Applicant: Taiwan Semiconductor Manufacturing Co., Ltd., Hsinchu (TW)

(72) Inventors: Kevin Tanady, Hsinchu (TW); Pei-Cheng Hsu, Hsinchu (TW); Ta-Cheng Lien, Hsinchu (TW); Tzu-Yi Wang, Hsinchu (TW); Hsin-Chang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 457 days.

(21) Appl. No.: 17/347,322

(22) Filed: Jun. 14, 2021

(65) Prior Publication Data
US 2022/0121101 A1    Apr. 21, 2022

Related U.S. Application Data

(60) Provisional application No. 63/092,907, filed on Oct. 16, 2020.

(51) Int. Cl.
*G03F 1/24* (2012.01)
*G03F 1/54* (2012.01)
*H01L 21/033* (2006.01)

(52) U.S. Cl.
CPC ............... *G03F 1/24* (2013.01); *G03F 1/54* (2013.01); *H01L 21/0332* (2013.01); *H01L 21/0337* (2013.01)

(58) Field of Classification Search
CPC ...................................... G03F 1/24; G03F 1/38
See application file for complete search history.

(56) References Cited

U.S. PATENT DOCUMENTS

| | | | |
|---|---|---|---|
| 2019/0146331 A1* | 5/2019 | Lin | ............ G03F 7/70033 430/5 |
| 2020/0073225 A1 | 3/2020 | Shih et al. | |

FOREIGN PATENT DOCUMENTS

| | | | |
|---|---|---|---|
| JP | 2010045317 A | * | 2/2010 |
| TW | 201923441 A | | 6/2019 |
| TW | 202026752 A | | 7/2020 |
| TW | I703403 B | | 9/2020 |

OTHER PUBLICATIONS

S. Selvarasah et al., "A reusable high aspect ratio parylene-C shadow mask technology . . . ", Aug. 2008, Sensors and Actuators A: Physical; vols. 145-146, pp. 306, 311-312 (Year: 2008).*

P. Fay, "Deposition Equipment", Feb. 10, 2015, University of Notre Dame Nanofabrication Facility (Year: 2015).*

* cited by examiner

*Primary Examiner* — Lex H Malsawma
*Assistant Examiner* — Bruce R. Smith
(74) *Attorney, Agent, or Firm* — Seed IP Law Group LLP

(57) ABSTRACT

An extreme ultraviolet mask includes a substrate, a reflective multilayer stack over the substrate, a capping layer over the reflective multilayer stack, a patterned absorber layer over a first portion of the capping layer, and a magnetic layer over a second portion of the capping layer around the first portion.

20 Claims, 33 Drawing Sheets

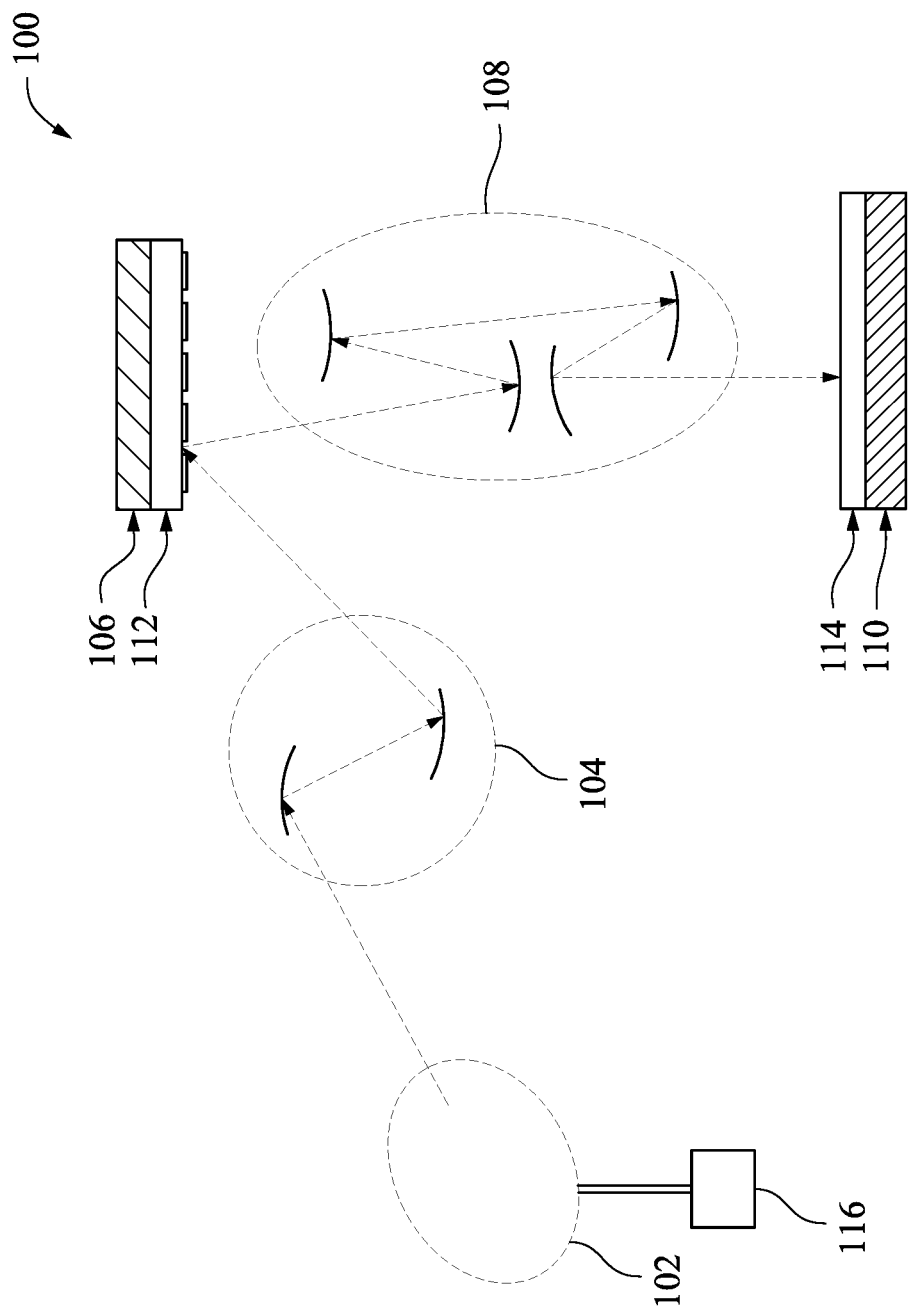

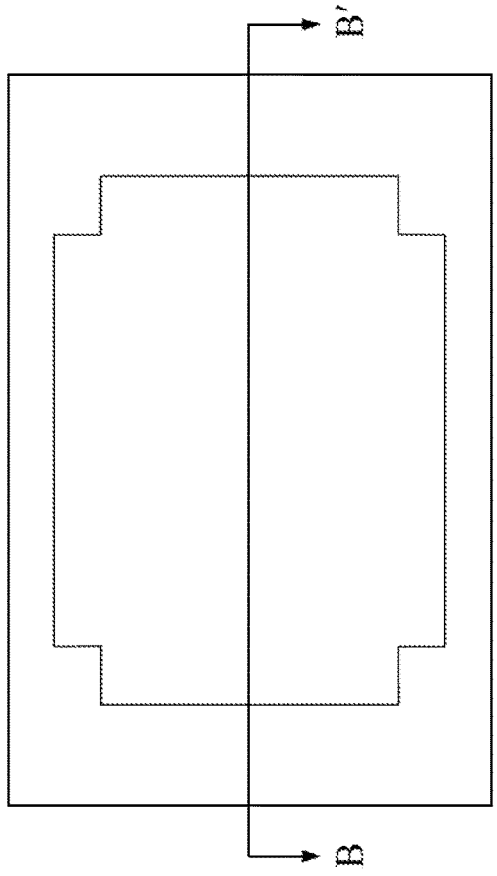
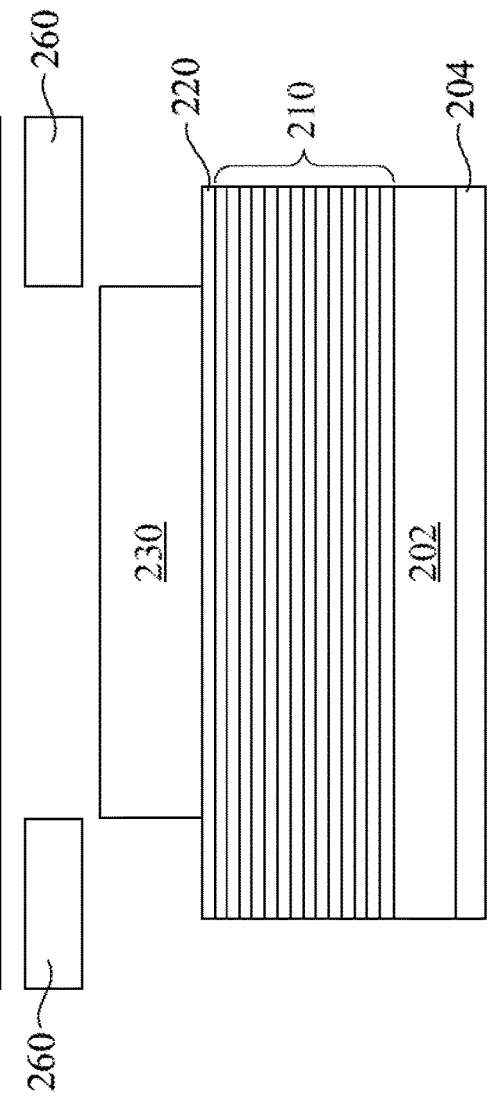

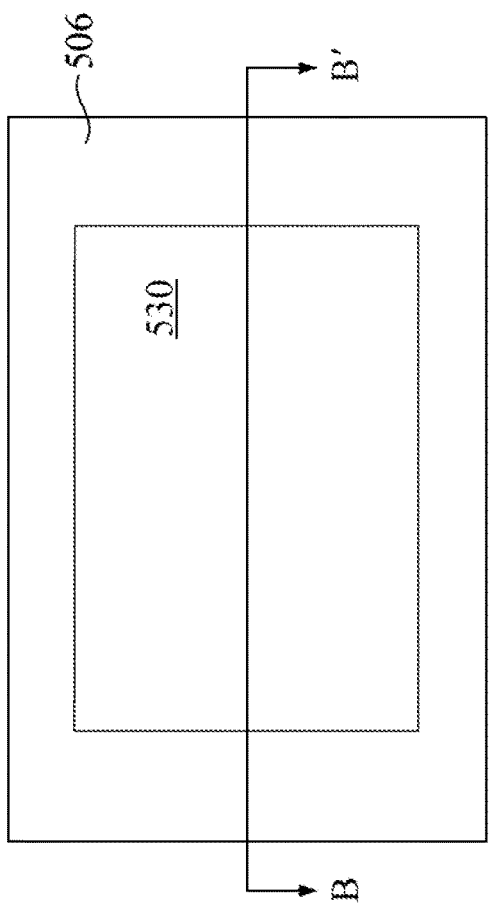
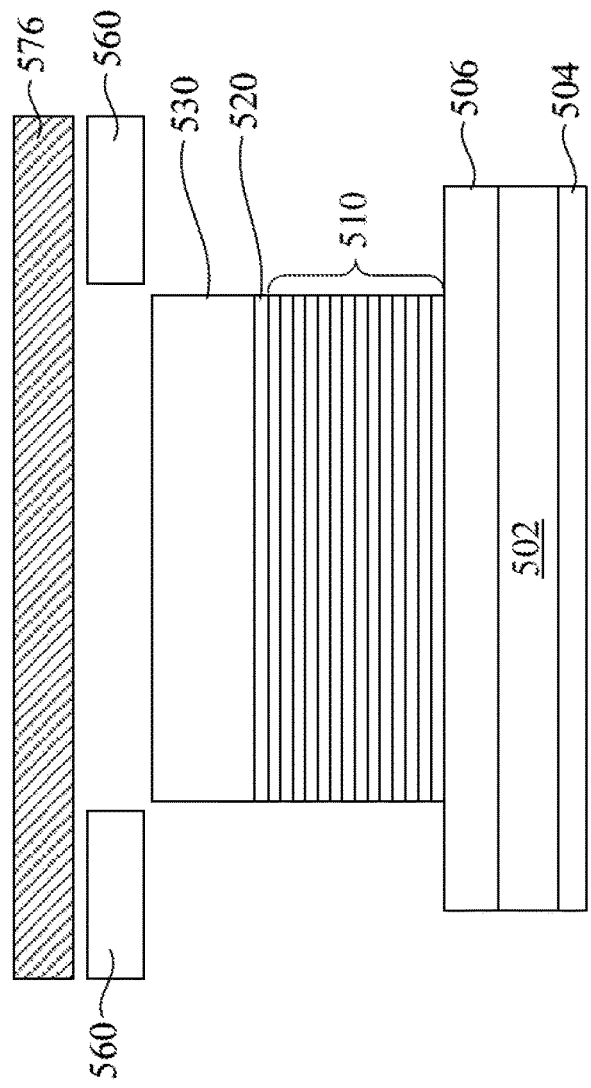
FIG. 7D
FIG. 7D'

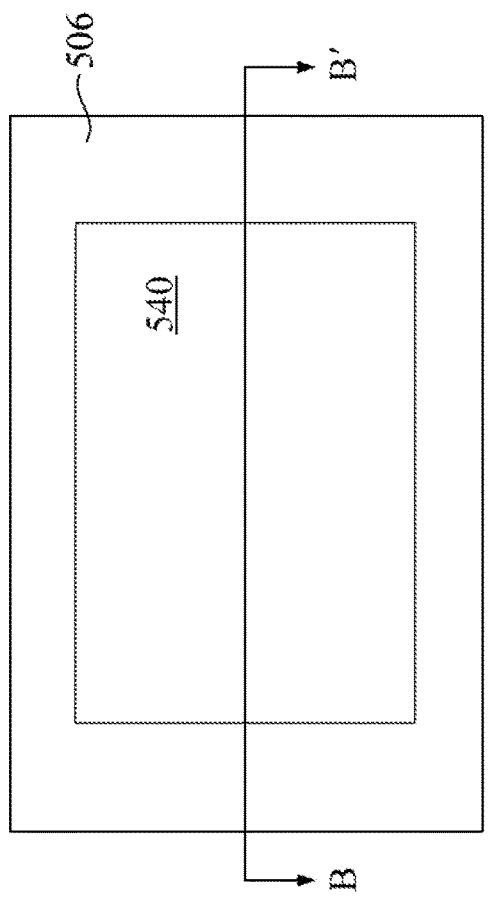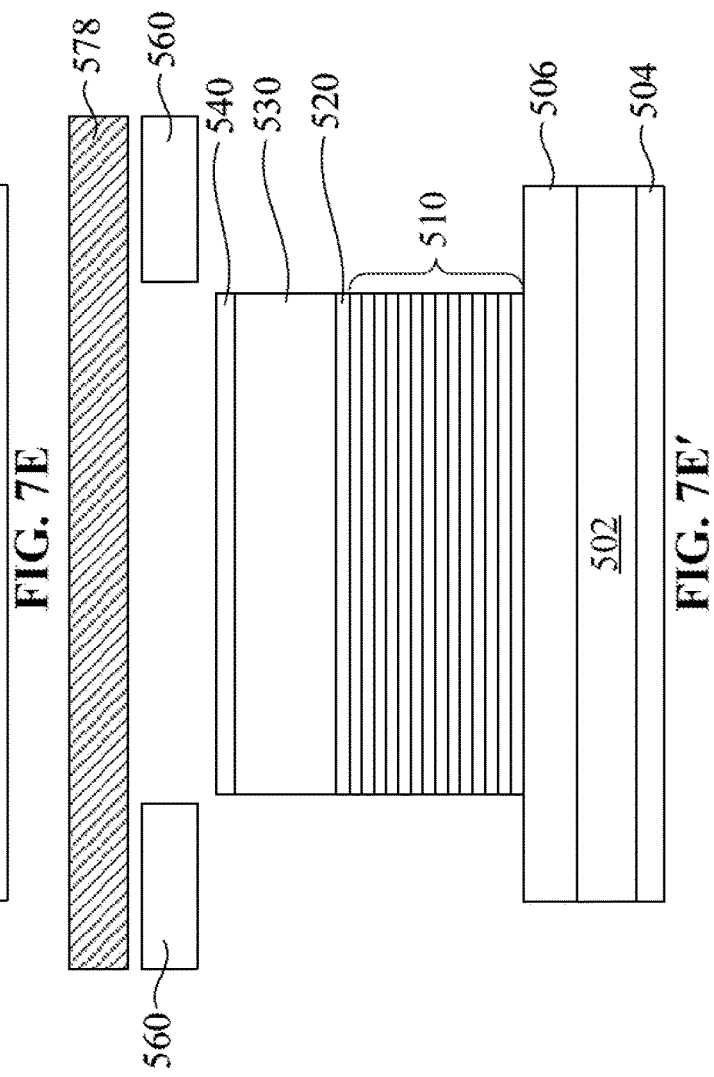

METHODS FOR FORMING EXTREME ULTRAVIOLET MASK COMPRISING MAGNETIC MATERIAL

PRIORITY CLAIM AND CROSS-REFERENCE

This application claims the benefit of U.S. Provisional Patent Application No. 63/092,907, filed Oct. 16, 2020, which is incorporated by reference herein in its entirety.

BACKGROUND

The semiconductor industry has experienced exponential growth. Technological advances in materials and design have produced generations of integrated circuits (ICs), where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a schematic block diagram of an extreme ultraviolet (EUV) scanner, in accordance with some embodiments.

FIG. 4A' is a cross-sectional view of the structure of FIG. 4A along line B-B', in accordance with some embodiments.

FIG. 4B' is a cross-sectional view of the structure of FIG. 4B along line B-B', in accordance with some embodiments.

FIG. 4C is a cross-sectional view of the structure of FIGS. 4B and 4B' after depositing an absorber layer over a portion of the capping layer, in accordance with some embodiments.

FIG. 4C' is a cross-sectional view of the structure of FIG. 4C along line B-B', in accordance with some embodiments.

FIG. 4D' is a cross-sectional view of the structure of FIG. 4D along line B-B', in accordance with some embodiments.

FIG. 4E' is a cross-sectional view of the structure of FIG. 4E along line B-B', in accordance with some embodiments.

FIG. 7A' is a cross-sectional view of the structure of FIG. 7A along line B-B', in accordance with some embodiments.

FIG. 7B' is a cross-sectional view of the structure of FIG. 7B along line B-B', in accordance with some embodiments.

FIG. 7C' is a cross-sectional view of the structure of FIG. 7C along line B-B', in accordance with some embodiments.

FIG. 7D is a top view of the structure of FIGS. 7C and 7C' after depositing an absorber layer over the capping layer, in accordance with some embodiments.

FIG. 7D' is a cross-sectional view of the structure of FIG. 7D along line B-B', in accordance with some embodiments.

FIG. 7E is a top view of the structure of FIGS. 7D and 7D' after depositing a hard mask layer over the absorber layer, in accordance with some embodiments.

FIG. 7E' is a cross-sectional view of the structure of FIG. 7E along line B-B', in accordance with some embodiments.

DETAILED DESCRIPTION

Figure 2A:
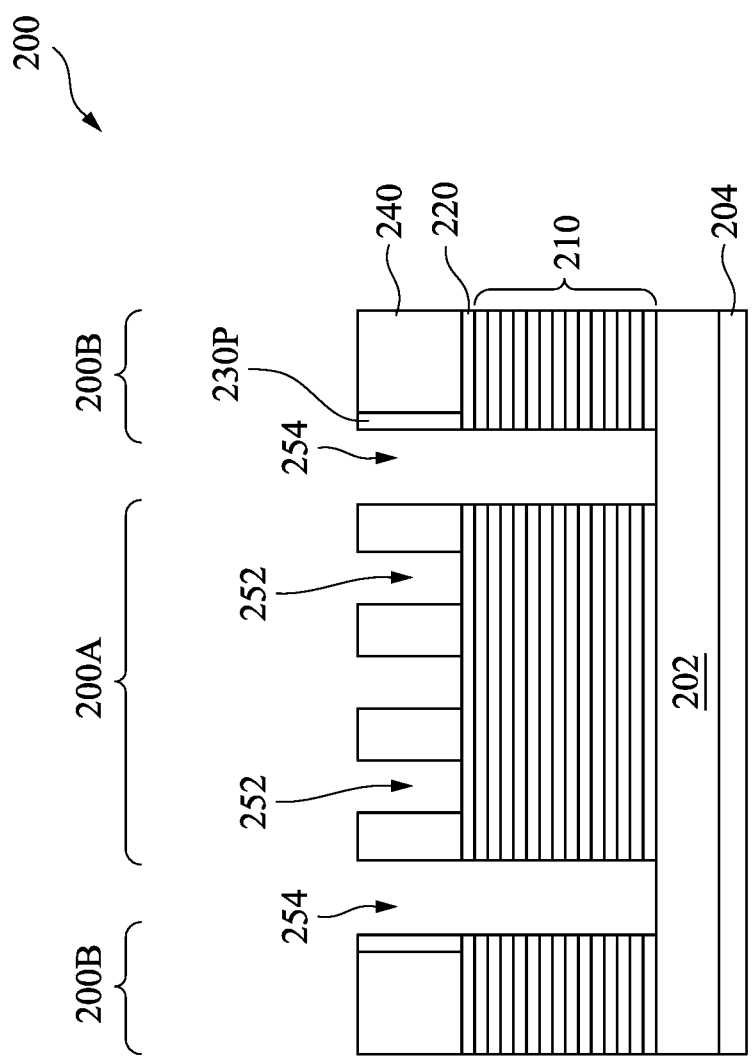
FIG. 2A is a cross-sectional view of a first exemplary EUV mask, in accordance with some embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the manufacture of integrated circuits (ICs), patterns representing different layers of the ICs are fabricated using a series of reusable photomasks (also referred to herein as masks) in order to transfer the design of each layer of the ICs onto a semiconductor substrate during the semiconductor device fabrication process. Thus, any defects in the masks may be transferred to the ICs, potentially severely affecting the device performance.

With the shrinkage in IC size, extreme ultraviolet (EUV) light having a wavelength of 13.5 nm is employed in a lithographic process to enable transfer of very small patterns (e.g., nanometer-scale patterns) from a mask to a semiconductor wafer. Because most materials are highly absorbing at the wavelength of 13.5 nm, EUV lithography utilizes a reflective-type mask which selectively reflects and absorbs EUV radiation. A pattern formed in an absorber layer of an EUV mask is transferred to a semiconductor wafer by reflecting EUV light off portions of a reflective surface of the EUV mask.

EUV lithography is implemented in an EUV scanner 100, as shown in FIG. 1. In some embodiments, the EUV scanner 100 includes a light source 102, an illuminator 104, a mask stage 106, a projection optics module 108, and a substrate stage 110.

The light source 102 is configured to generate EUV light with a wavelength centered at about 13.5 nm.

The illuminator 104 includes reflective optics such as a single mirror or a mirror system having multiple mirrors in order to direct light from the light source 102 onto a mask stage 106, particularly to an EUV mask 112 secured on the mask stage 106.

The mask stage 106 is configured to secure the EUV mask 112. In some embodiments, the mask stage 106 includes an electrostatic chuck (e-chuck) to secure the EUV mask 112. A backside of EUV mask 112 is chucked by applying an bias potential of, for example, about 1 kV to the mask stage 106, the front surface of the EUV mask 112 faces the upper surface of a semiconductor wafer 114 on the substrate stage 110.

The projection optics module 108 is configured to provide a patterned beam and project the patterned beam onto the semiconductor wafer 114, so as to image the pattern of the EUV mask 112 on to the semiconductor wafer 114 secured on a substrate stage 110. The light directed from the EUV mask 112, carrying the image of the pattern defined on the EUV mask 112, is collected by the projection optics module 108. In some embodiments, the illuminator 104 and the projection optics module 108 are collectively referred to as an optical module of the EUV scanner 100.

The EUV scanner 100 may further include other modules or be integrated with (or be coupled with) other modules. For example, the gas supply module 116 is configured to provide hydrogen gas to the light source 102, so as to decrease contamination of the light source 12.

Because of the extremely short exposure wavelength of 13.5 nm, a small perturbation in the surface of the EUV mask 112 can cause a phase defect in the reflection that can blur the pattern transferred onto the semiconductor wafer 114. Some phase defects are caused by magnetic particles such as iron (Fe) or nickel (Ni) from the parts of the EUV scanner 100 or from the semiconductor wafer 114. These contamination particles can attach to the pattern region of EUV mask 112 during the EUV lithography, causing critical dimension error during wafer exposure.

In embodiments of the present disclosure, binary absorber materials are used to prevent magnetic particles from falling on the pattern region of an EUV mask. In embodiments of the present disclosure, a patterned absorber layer comprised of a non-magnetic material is provided in a pattern region of the EUV mask and a magnetic layer comprised of a magnetic material is employed in a border region of the EUV mask. During the EUV lithography process, the bias potential used to electrically chuck the EUV mask to the mask stage of the EUV scanner may generate a magnetic field. Under the magnetic field, the magnetic layer in the border region of the EUV mask attracts magnetic particles, and thus helps to deflect away the magnetic particles that may otherwise be attached to the pattern region of the EUV mask. By preventing the magnetic particles from becoming attached to the pattern region of the EUV mask, the patterning errors caused by the contamination particles on the pattern region of the EUV mask during the EUV lithography can be avoided. Depending on the magnetic strength and the etching characteristics of the magnetic material, the magnetic layer can be formed adjoined to the patterned absorber layer or directly on top of the substrate of the EUV mask.

Figure 2B:
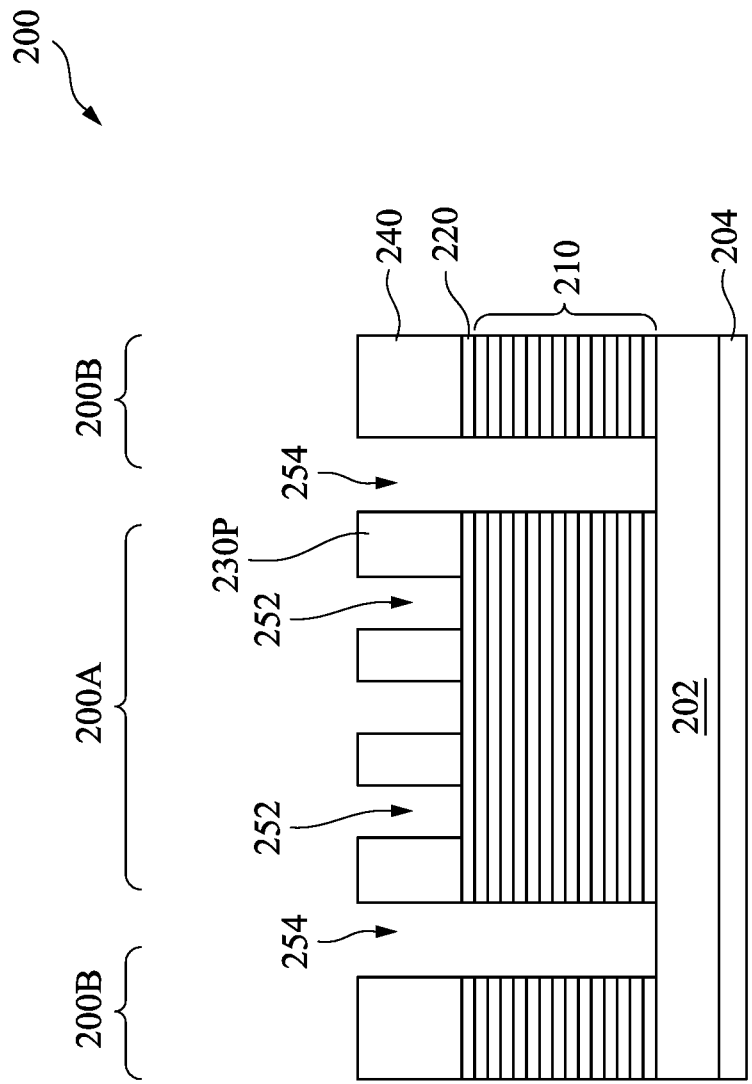
FIG. 2B is a cross-sectional view of a first exemplary EUV mask, in accordance with some alternative embodiments.

FIG. 2A is a cross-sectional view of a first exemplary EUV mask 200, in accordance with some embodiments of the present disclosure. FIG. 2B is a cross-sectional view of a first exemplary EUV mask 200, in accordance with some alternative embodiments of the present disclosure. Referring to FIGS. 2A and 2B, the EUV mask 200 includes a substrate 202, a reflective multilayer stack 210 over a front surface of the substrate 202, a capping layer 220 over the reflective multilayer stack 210, a patterned absorber layer 230P over a portion of the capping layer 220, and a magnetic layer 240 over a peripheral portion of the capping layer 220 and surrounding the patterned absorber layer 230P. The EUV mask 200 further includes a conductive layer 204 over a back surface of the substrate 202 opposite the front surface.

The patterned absorber layer 230P contain a pattern of openings 252 that correspond to circuit patterns to be formed on a semiconductor wafer. The pattern of openings 252 is located in a pattern region 200A of the EUV mask 200, exposing a surface of the capping layer 220. The pattern region 200A is surrounded by a border region 200B of the EUV mask 200. The border region 200B corresponds to a non-patterned region of the EUV mask 200 that is not used in an exposing process during IC fabrication. In some embodiments, the pattern region 200A of EUV mask 200 is located at a central region of the substrate 202, and the border region 200B is located at a peripheral portion of the substrate 202. The pattern region 200A is separated from the border region 200B by trenches 254. The trenches 254 extend through the patterned absorber layer 230P, the capping layer 220, and the reflective multilayer stack 210, exposing the front surfaced of the substrate 202. In some embodiments and as shown in FIG. 2A, a first portion of the patterned absorber layer 230P is located in the pattern region 200A of the EUV mask 200, while a second portion of the patterned absorber layer 230P and the magnetic layer 240 are located in the border region 200B of the EUV mask 200. In some other embodiments and as shown in FIG. 2B, an entirety of the patterned absorber layer 230P is located in the pattern region 200A of the EUV mask 200, while the magnetic layer 240 is located in the border region 200B of the EUV mask 200.

During the EUV lithography, the magnetic layer 240 in the border region 200B of the EUV mask 200 attracts and holds the magnetic particles thereon. As a result, the contamination particles in the EUV scanner 100 (FIG. 1) that may otherwise attached to the pattern region 200A of the EUV mask 200 can be deflected away by the magnetic layer 240. Introducing the magnetic layer 240 around the patterned absorber layer 230P thus helps to prevent contamination particles from becoming attached to the pattern region 200A of the EUV mask 200 during EUV lithography, which in turn helps to improve the fidelity of lithographically transferred pattern and reduce patterning errors.

Figure 3:
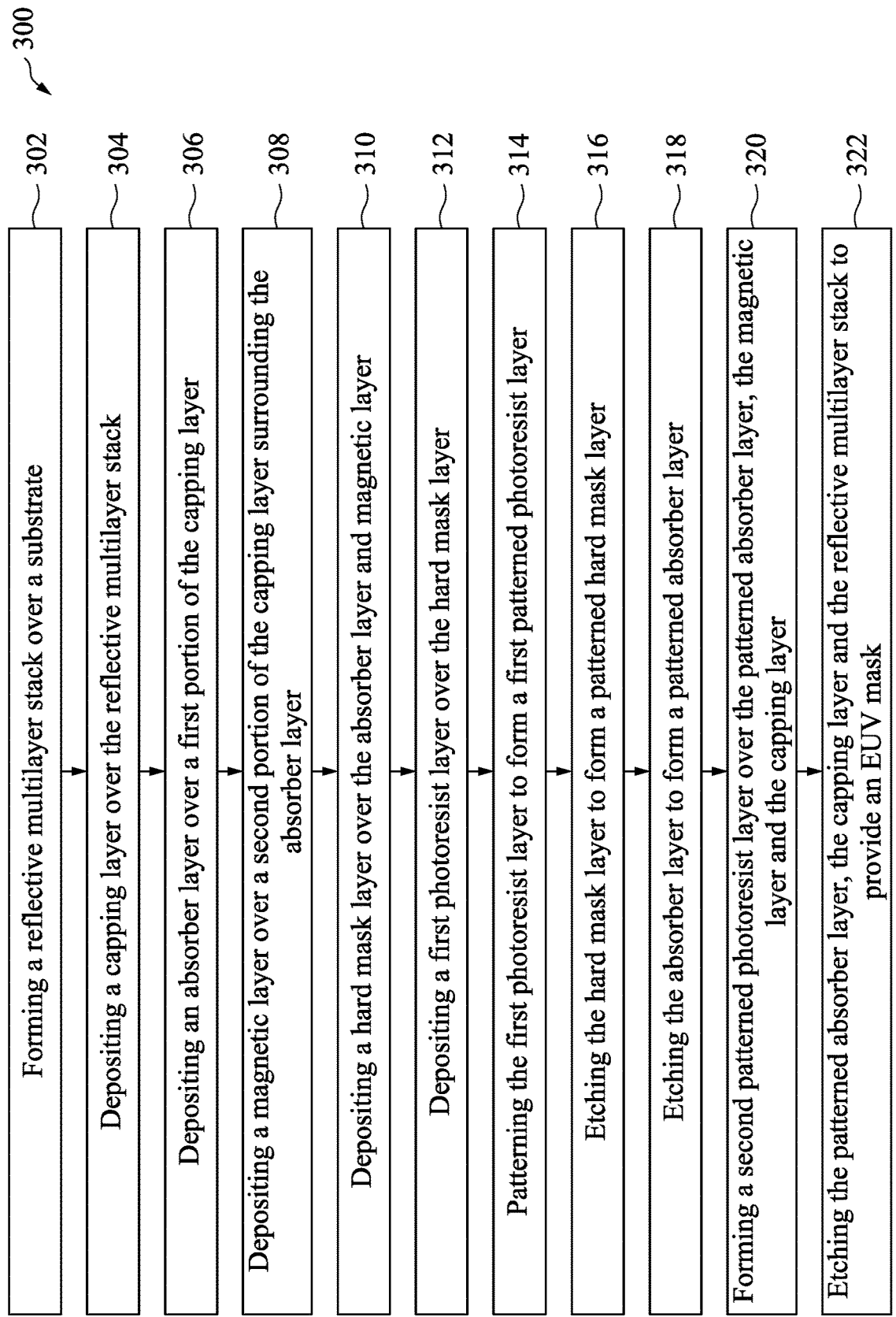
FIG. 3 is a flowchart of a method for fabricating the first exemplary EUV masks, in accordance with some embodiments.

FIG. 3 is a flowchart of a method 300 for fabricating an EUV mask, for example, EUV mask 200, in accordance with some embodiments. FIG. 4A through FIG. 4M are various views of the EUV mask 200 at various stages of the fabrication process, in accordance with some embodiments. The method 300 is discussed in detail below, with reference to the EUV mask 200. In some embodiments, additional operations are performed before, during, and/or after the method 300, or some of the operations described are replaced and/or eliminated. In some embodiments, some of the features described below are replaced or eliminated. One of ordinary skill in the art would understand that although some embodiments are discussed with operations performed in a particular order, these operations may be performed in another logical order.

Figure 4A:
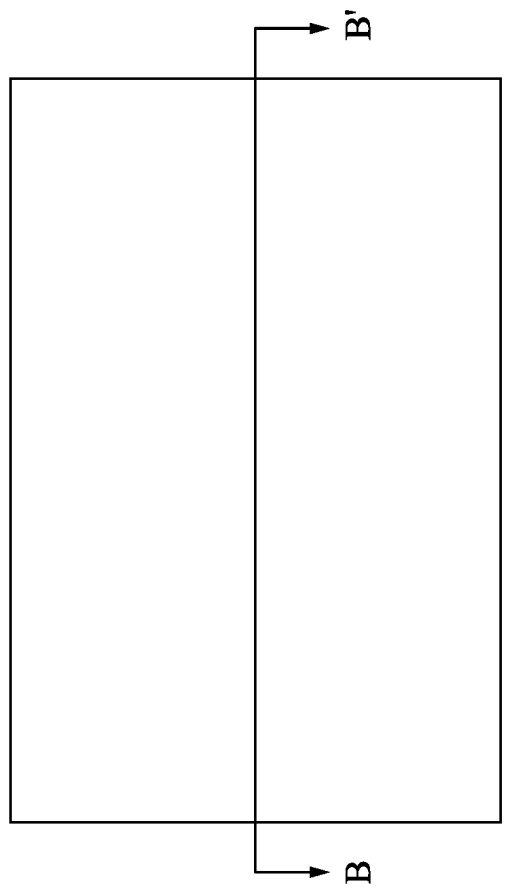
FIG. 4A is a top view of an initial structure of an EUV mask after forming a reflective multilayer stack over a substrate, in accordance with some embodiments.
Figure 4A:
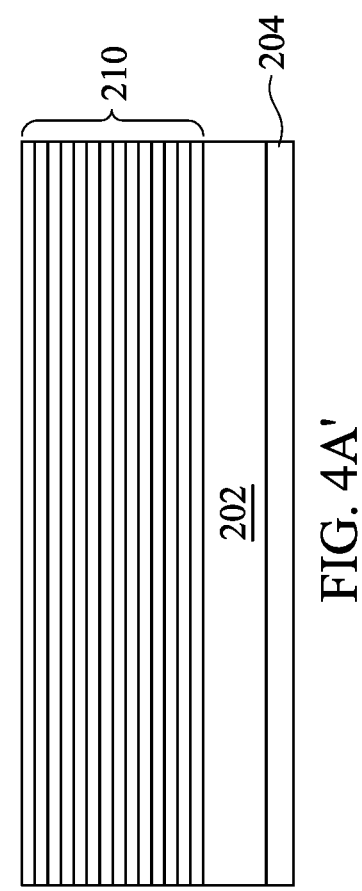

Referring to FIG. 3, the method 300 includes operation 302, in which a reflective multilayer stack 210 is formed over a substrate 202, in accordance with some embodiments. FIG. 4A is a top view of an initial structure of an EUV mask 200 after forming the reflective multilayer stack 210 over the substrate 202, in accordance with some embodiments. FIG. 4A' is a cross-sectional view of the initial structure of the EUV mask 200 of FIG. 4A along line B-B'.

Referring to FIGS. 4A and 4A', the initial structure of the EUV mask 200 includes a substrate 202 made of glass, silicon, or other low thermal expansion materials. The low thermal expansion material helps to minimize image distortion due to mask heating during use of the EUV mask 200. In some embodiments, the substrate 202 includes fused silica, fused quartz, calcium fluoride, silicon carbide, black diamond, or titanium oxide doped silicon oxide ($SiO_2/TiO_2$). In some embodiments, the substrate 202 has a thickness ranging from about 1 mm to about 7 mm. If the thickness of the substrate 202 is too small, a risk of breakage or warping of the EUV mask 200 increases, in some instances. On the other hand, if the thickness of the substrate is too great, a weight of the EUV mask 200 is needlessly increased, in some instances.

In some embodiments, a conductive layer 204 is disposed on a back surface of the substrate 202. In some embodiments, the conductive layer 204 is in direct contact with the back surface of the substrate 202. The conductive layer 204 provides a conductive plane to allow the EUV mask 200 to be electrostatically clamped to a mask stage during fabrication and use of the EUV mask 200. In some embodiments, the conductive layer 204 includes chromium nitride (CrN) or tantalum boride (TaB). In some embodiments, the conductive layer 204 is formed by a deposition process such as, for example, chemical vapor deposition (CVD), plasma-enhanced chemical vapor deposition (PECVD), or physical vapor deposition (PVD). The thickness of the conductive layer 204 is controlled such that the conductive layer 204 is optically transparent.

The reflective multilayer stack 210 is disposed over a front surface of the substrate 202 opposite the back surface. In some embodiments, the reflective multilayer stack 210 is in directly contact with the front surface of the substrate 202. The reflective multilayer stack 210 provides a high reflectivity to the EUV light. In some embodiments, the reflective multilayer stack 210 is configured to achieve about 60% to about 75% reflectivity at the peak EUV illumination wavelength, e.g., the EUV illumination at 13.5 nm.

In some embodiments, the reflective multilayer stack 210 includes alternatively stacked layers of a high refractive index material and a low refractive index material. A material having a high refractive index has a tendency to scatter EUV light and on the other hand, a material having a low refractive index has a tendency to transmit EUV light. Pairing these two type materials together provides a resonant reflectivity. In some embodiments, the reflective multilayer stack 210 includes alternatively stacked layers of molybdenum (Mo) and silicon (Si). In some embodiments, the reflective multilayer stack 210 includes alternatively stacked Mo and Si layers with Si being in the topmost layer. In some embodiments, a molybdenum layer is in direct contact with the front surface of the substrate 202. In other some embodiments, a silicon layer is in direct contact with the front surface of the substrate 202. Alternatively, the reflective multilayer stack 210 includes alternatively stacked layers of Mo and beryllium (Be).

The thickness of each layer in the reflective multilayer stack 210 depends on the EUV wavelength and the incident angle of the EUV light. The thickness of alternating layers in the reflective multilayer stack 210 is tuned to maximize the constructive interference of the EUV light reflected at each interface and to minimize the overall absorption of the EUV light. In some embodiments, the reflective multilayer stack 210 includes from 30 to 60 pairs of alternating layers of Mo and Si. Each Mo/Si pair has a thickness ranging from about 2 nm to about 7 nm, with a total thickness ranging from about 100 nm to about 300 nm.

In some embodiments, each layer in the reflective multilayer stack 210 is deposited over the substrate 202 and underlying layer using ion beam deposition or DC magnetron sputtering. The deposition method used helps to ensure the thickness uniformity of the reflective multilayer stack 210 is better than about 0.85 across the substrate 202. For example, to form a Mo/Si reflective multilayer stack 210, a Mo layer is deposited using a Mo target as the sputtering target and an argon (Ar) gas (having a gas pressure of from $1.3 \times 10^{-2}$ Pa to $2.7 \times 10^{-2}$ Pa) as the sputtering gas with an ion acceleration voltage of from 300 V to 1,500 V at a deposition rate of from 0.03 to 0.30 nm/sec and then a Si layer is deposited using a Si target as the sputtering target and an Ar gas (having a gas pressure of $1.3 \times 10^{-2}$ Pa to $2.7 \times 10^{-2}$ Pa) as the sputtering gas, with an ion acceleration voltage of from 300 V to 1,500 V at a deposition rate of from 0.03 to 0.30 nm/sec. By stacking Si layers and Mo layers in 40 to 50 cycles, each of the cycles comprising the above steps, the Mo/Si reflective multilayer stack is deposited.

Figure 4B:
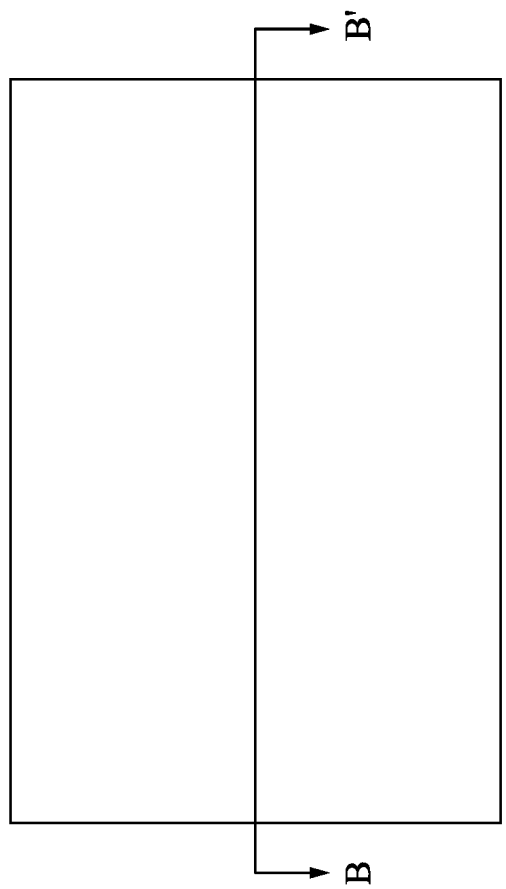
FIG. 4B is a top view of the structure of FIGS. 4A and 4A' after depositing a capping layer over the reflective multilayer stack, in accordance with some embodiments.
Figure 4B:
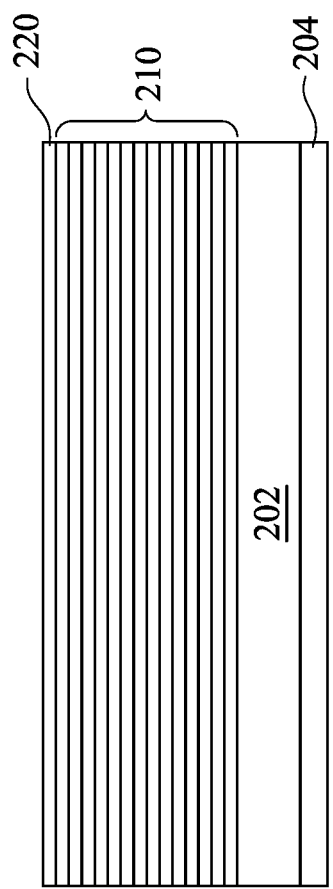

At operation 304 of the method 300, a capping layer 220 is deposited over the reflective multilayer stack 210, in accordance with some embodiments. FIG. 4B is a top view of the structure of FIGS. 4A and 4A' after depositing the capping layer 220 over the reflective multilayer stack 210, in accordance with some embodiments. FIG. 4B' is a cross-sectional view of the structure of FIG. 4B along line B-B'.

Referring to FIGS. 4B and 4B', the capping layer 220 is disposed over the topmost surface of the reflective multilayer stack 210. The capping layer 220 helps to protect the reflective multilayer stack 210 from oxidation and any chemical etchants to which the reflective multilayer stack 210 may be exposed during subsequent mask fabrication processes.

In some embodiments, the capping layer 220 includes a material that resists oxidation and corrosion, and has a low chemical reactivity with common atmospheric gas species such as oxygen, nitrogen, and water vapor. In some embodiments, the capping layer 220 includes transition metals such as zirconium (Zr) or ruthenium (Ru), ruthenium compounds such as RuB, RuO, ruthenium alloys such as RuNb, or ruthenium alloy compounds such as RuNbO.

In some embodiments, the capping layer 220 is formed using a deposition process such as, for example, ion beam deposition, chemical vapor deposition (CVD), physical vapor deposition (PVD) such as DC magnetron sputtering, or atomic layer deposition (ALD). In instances where a Ru layer is to be formed as the capping layer 220 using ion beam deposition, the deposition may be carried out in an Ar atmosphere by using a Ru target as the sputtering target.

At operation 306 of the method 300, an absorber layer 230 is deposited over a portion of the capping layer 220, in accordance with some embodiments. FIG. 4C is a cross-sectional view of the structure of FIGS. 4B and 4B' after depositing the absorber layer 230 over the portion of the capping layer 220, in accordance with some embodiments. FIG. 4C' is a cross-sectional view of the structure of FIG. 4C along line B-B'.

Referring to FIGS. 4C and 4C', the absorber layer 230 is disposed over a central portion of the capping layer 220. The absorber layer 230 is usable to absorb radiation in the EUV wavelength projected onto the EUV mask 200. The absorber layer 230 includes a material having a high absorption coefficient in EUV wavelengths. In some embodiments, the absorber layer 230 includes a material having a high absorption coefficient at 13.5 nm wavelength. In some embodiments, the absorber layer 230 includes chromium (Cr), chromium oxide (CrO), titanium nitride (TiN), tantalum nitride (TaN), tantalum (Ta), titanium (Ti), Mo, aluminum copper (AlCu), palladium (Pd), tantalum boron nitride (TaBN), tantalum boron oxide (TaBO), aluminum oxide ($Al_2O_3$), silver oxide ($Ag_2O$), or combinations thereof. In some embodiments, the absorber layer 230 has a single layer structure. In some other embodiments, the absorber layer 230 has a multilayer structure. In some embodiments, the absorber layer 230 is formed by a deposition process such as, for example, CVD, PECVD, PVD such as DC magnetron sputtering, ion beam deposition, or ALD. In some embodiments, the absorber layer 230 is deposited by sputtering a target 265 of absorber material in an argon atmosphere. During the deposition process, a shielding plate 260 is placed between the substrate 202 and the target 265 to control the location and size of the absorber layer 230. In some embodiments, the shielding plate 260 is positioned to shadow the peripheral portion of the capping layer 220 so that sputtered atoms are only received by the un-shadowed central portion of the capping layer 220. As a result, the absorber layer 230 is only formed on the central portion of the capping layer 220, but not on the peripheral portion of the capping layer 220. In some embodiments, the absorber layer 230 is formed to have a first strip extending in a first direction and a second strip extending in a second direction traverse the first direction. In some embodiments, each of the first strip and the second strip has a length of 132 cm and a width of 104 cm or a length of 134 cm and a width of 106 cm, although other lengths and widths are possible.

Figure 4D:
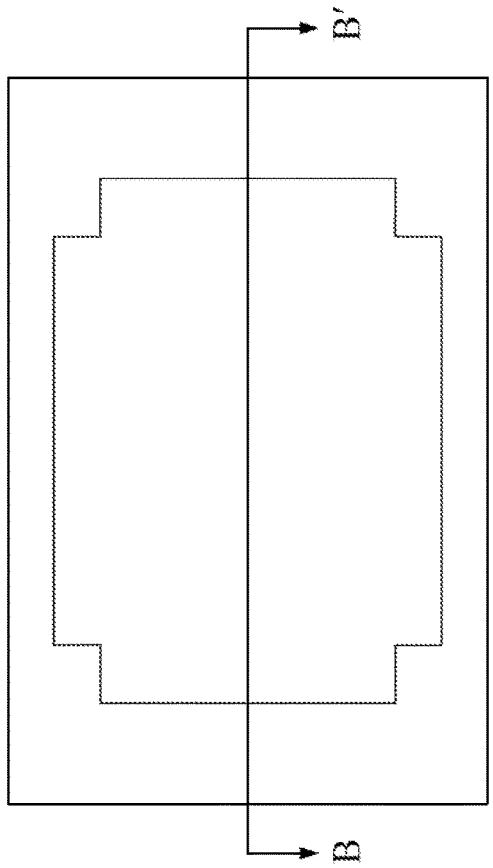
FIG. 4D is a top view of the structure of FIGS. 4C and 4C' after depositing a magnetic layer over a portion of the capping layer that is not occupied by the absorber layer, in accordance with some embodiments.
Figure 4D:
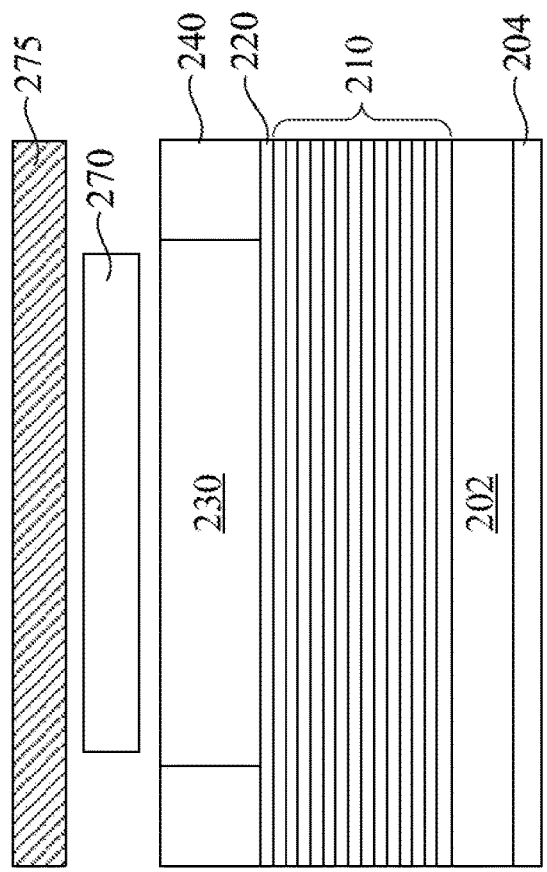

At operation 308 of the method 300, a magnetic layer 240 is deposited over a portion of the capping layer 220 that is not occupied by the absorber layer 230, in accordance with some embodiments. FIG. 4D is a top view of the structure of FIGS. 4C and 4C' after depositing the magnetic layer 240 over the portion of the capping layer 220 that is not occupied by the absorber layer 230, in accordance with some embodiments. FIG. 4D' is a cross-sectional view of the structure of FIG. 4D along line B-B'.

Referring to FIGS. 4D and 4D', the magnetic layer 240 is disposed over the peripheral portion of the capping layer 220, laterally abutting the absorber layer 230. In some embodiments, the magnetic layer 240 includes a magnetic material having a sufficient magnetic strength capable of attracting magnetic particles during EUV lithography. In some embodiments, the magnetic layer 240 includes iron (Fe), nickel (Ni), cobalt (Co), or alloys thereof such as CoFe, FeNi, or CoFeNi. In some embodiments, the magnetic layer 240 is formed by a deposition process such as, for example, CVD, PECVD, PVD such as DC magnetron sputtering, ion beam deposition, or ALD. In some embodiments, the magnetic layer 240 is deposited by sputtering a target 275 of magnetic material in an argon atmosphere. During the deposition process, a shielding plate 270 is placed between the substrate 202 and the target 275 to control the location and size of the magnetic layer 240. In some embodiments, the shielding plate 270 is positioned to shadow the central portion of the capping layer 220 where the absorber layer 230 is located so that sputtered atoms are only received by the un-shadowed peripheral portion of the capping layer 220. As a result, the magnetic layer 240 is only formed on the peripheral portion of the capping layer 220, but not on the central portion of the capping layer 220.

Figure 4E:
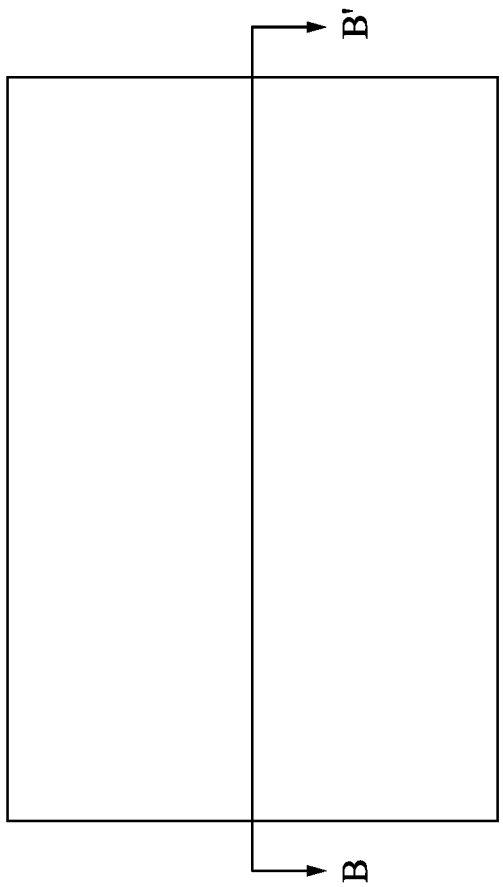
FIG. 4E is a top view of the structure of FIGS. 4D and 4D' after depositing a hard mask layer over the absorber layer and the magnetic layer, in accordance with some embodiments.
Figure 4E:
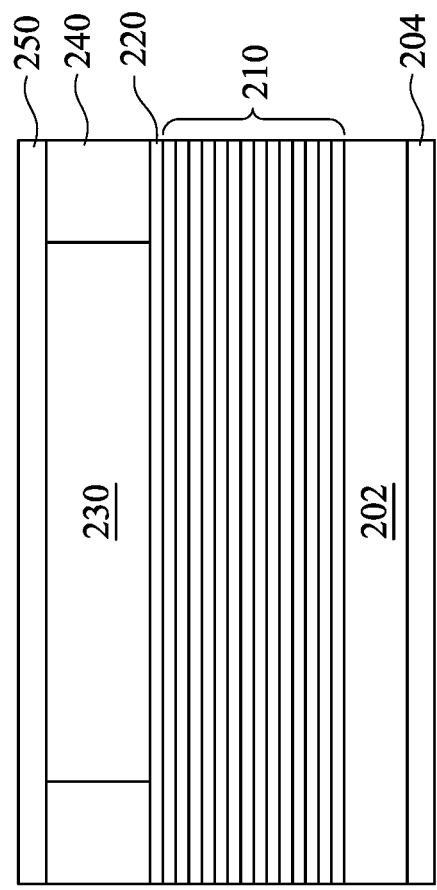

At operation 310 of the method 300, a hard mask layer 250 is deposited over the absorber layer 230 and the magnetic layer 240, in accordance with some embodiments. FIG. 4E is a top view of the structure of FIGS. 4D and 4D' after depositing the hard mask layer 250 over the absorber layer 230 and the magnetic layer 240, in accordance with some embodiments. FIG. 4E' is a cross-sectional view of the structure of FIG. 4E along line B-B'.

Referring to FIGS. 4E and 4E', the hard mask layer 250 is disposed directly over the absorber layer 230 and the magnetic layer 240. In some embodiments, the hard mask layer 160 includes a dielectric oxide such as silicon dioxide or a dielectric nitride such as silicon nitride. In some embodiments, the hard mask layer 250 is formed using a deposition process such as, for example, CVD, PECVD, or PVD.

Figure 4F:
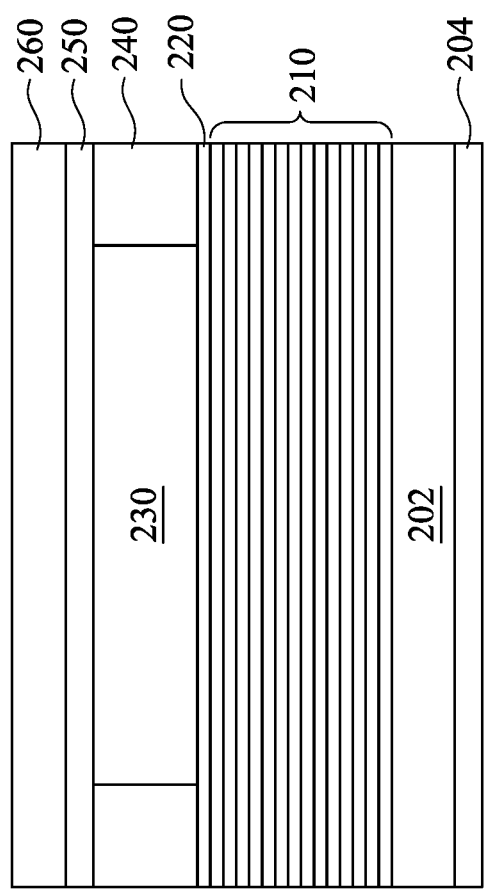
FIG. 4F is a cross-sectional view of the structure of FIGS. 4E and 4E' after applying a first photoresist layer over the hard mask layer, in accordance with some embodiments.

At operation 312 of the method 300, a first photoresist layer 260 is applied over the hard mask layer 250, in accordance with some embodiments. FIG. 4F is a cross-sectional view of the structure of FIGS. 4E and 4E' after applying the first photoresist layer 260 over the hard mask layer 250, in accordance with some embodiments.

Referring to FIG. 4F, the first photoresist layer 260 is disposed directly over the hard mask layer 250. The first photoresist layer 260 includes a photosensitive material operable to be patterned by radiation. In some embodiments, the first photoresist layer 260 includes a positive-tone photoresist material, a negative-tone photoresist material or a hybrid-tone photoresist material. In some embodiments, the first photoresist layer 260 is applied to the surface of the hard mask layer 250, for example, by spin coating.

Figure 4G:
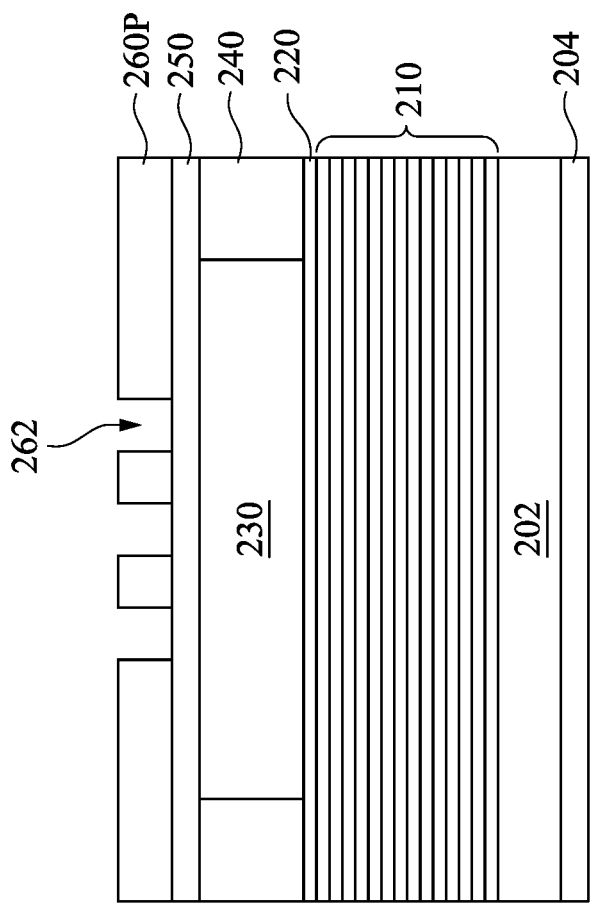
FIG. 4G is a cross-sectional view of the structure of FIG. 4F after lithographically patterning the first photoresist layer to form a patterned first photoresist layer, in accordance with some embodiments.

At operation 314 of the method 300, the first photoresist layer 260 is lithographically patterned to form a patterned first photoresist layer 260P, in accordance with some embodiments. FIG. 4G is a cross-sectional view of the structure of FIG. 4F after lithographically patterning the first photoresist layer 260 to form the patterned first photoresist layer 260P, in accordance with some embodiments.

Referring to FIG. 4G, the first photoresist layer 260 is patterned by subjecting the first photoresist layer 260 to a pattern of irradiation. Next, the exposed or unexposed portions of the first photoresist layer 260 are removed depending on whether a positive-tone or negative-tone resist is used in the first photoresist layer 260 with a resist developer, thereby forming the patterned first photoresist layer 260P having a pattern of openings 262 formed therein. The openings 262 expose portions of the hard mask layer 250. The openings 262 are located in the pattern region 200A and correspond to locations where openings 252 are present in the EUV mask 200 (FIGS. 2A and 2B).

Figure 4H:
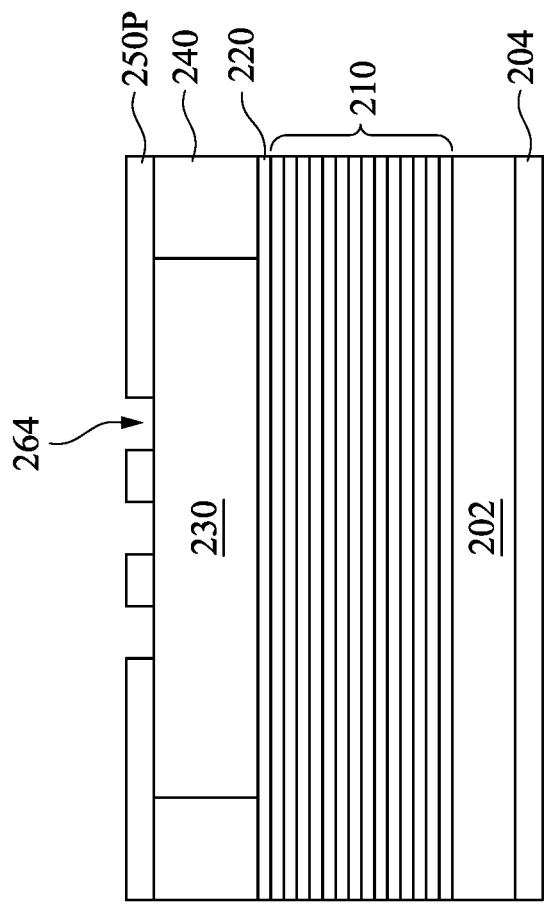
FIG. 4H is a cross-sectional view of the structure of FIG. 4G after etching the hard mask layer to form a patterned hard mask layer, in accordance with some embodiments.

At operation 316 of the method 300, the hard mask layer 250 is etched using the patterned first photoresist layer 260P as an etch mask to form a patterned hard mask layer 250P, in accordance with some embodiments. FIG. 4H is a cross-sectional view of the structure of FIG. 4G after etching the hard mask layer 250 to form the patterned hard mask layer 250P, in accordance with some embodiments.

Referring to FIG. 4H, portions of the hard mask layer 250 that are exposed by the openings 262 in the patterned first photoresist layer 260P are etched to form openings 264. The openings 264 extend through the hard mask layer 250, exposing portions of the underlying absorber layer 230. In some embodiments, the hard mask layer 250 is etched using an anisotropic etch. In some embodiments, the anisotropic etch is a dry etch such as, for example, reactive ion etch (RIE), a wet etch, or a combination thereof. The etch removes the material providing the hard mask layer 250 selective to the material providing the absorber layer 230. The remaining portions of the hard mask layer 250 constitute the patterned hard mask layer 250P. If not completely consumed during the etching of the hard mask layer 250, after etching the hard mask layer 250, the patterned first photoresist layer 260P is removed from the surfaces of the patterned hard mask layer 250P, for example, using wet stripping or plasma ashing.

Figure 4I:
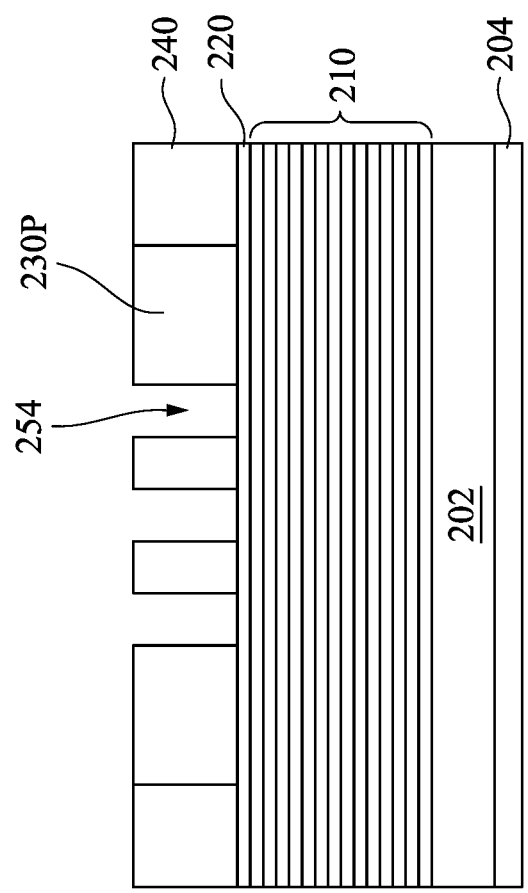
FIG. 4I is a cross-sectional view of the structure of FIG. 4G after etching the absorber layer to form a patterned absorber layer, in accordance with some embodiments.

At operation 318 of the method 300, the absorber layer 230 is etched using the patterned hard mask layer 250P as an etch mask to form a patterned absorber layer 230P, in accordance with some embodiments. FIG. 4I is a cross-sectional view of the structure of FIG. 4G after etching the absorber layer 230 to form the patterned absorber layer 230P, in accordance with some embodiments.

Referring to FIG. 4I, portions of the absorber layer 230 that are exposed by the openings 264 in the patterned hard mask layer 250P are etched to form openings 252. The openings 252 extend through the absorber layer 230, exposing portions of the underlying capping layer 220. In some embodiments, the absorber layer 230 is etched using an anisotropic etching process. In some embodiments, the anisotropic etch is a dry etch such as, for example, RIE, a wet etch, or a combination thereof that removes the material providing the absorber layer 230 selective to the material providing the capping layer 220. For example, in some embodiments, the absorber layer 230 is dry etched with a gas that contains chlorine, such as $Cl_2$ or $BCl_3$, or with a gas that contains fluorine, such as $NF_3$. Ar may be used as a carrier gas. In some embodiments, oxygen ($O_2$) may also be included as the carrier gas. The etch rate and the etch selectivity depend on the etchant gas, etchant flow rate, power, pressure, and substrate temperature. After etching, the patterned hard mask layer 250P is removed, for example, by oxygen plasma. The remaining portions of the absorber layer 230 constitute the patterned absorber layer 230P.

Figure 4J:
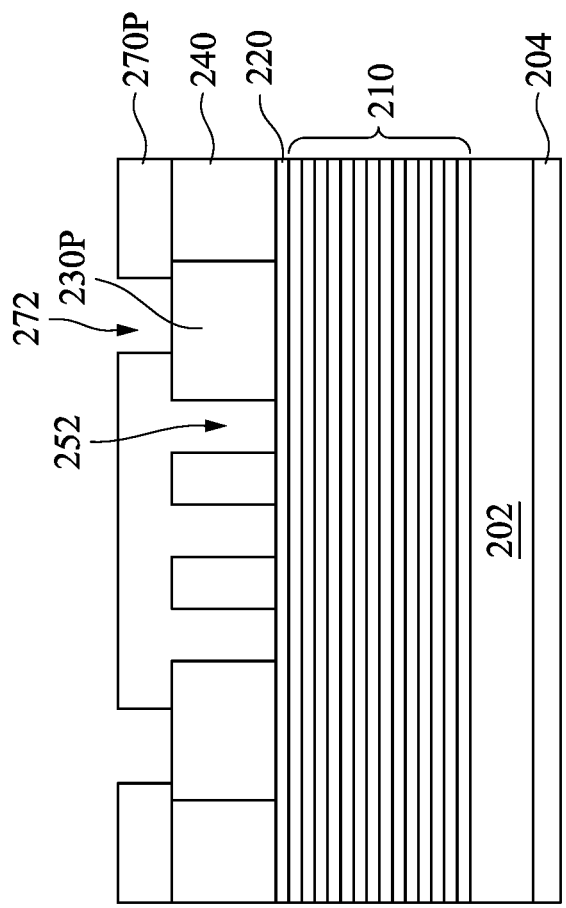
FIG. 4J is a cross-sectional view of the structure of FIG. 4I after forming a patterned second photoresist layer including openings over the patterned absorber layer, the magnetic layer and the capping layer, in accordance with some embodiments.
Figure 4K:
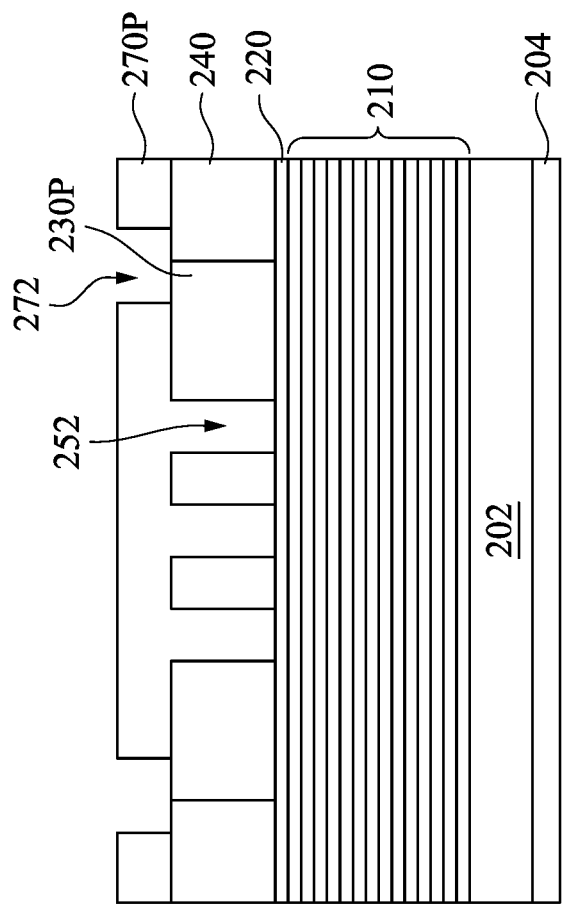
FIG. 4K is a cross-sectional view of the structure of FIG. 4I after forming a patterned second photoresist layer including openings over the patterned absorber layer, the magnetic layer and the capping layer, in accordance with some other embodiments.

At operation 320 of the method 300, a patterned second photoresist layer 270P including a pattern of openings 272 is formed over the patterned absorber layer 230P, the magnetic layer 240, and the capping layer 220, in accordance with some embodiments. FIGS. 4J and 4K are cross-sectional views of the structure of FIG. 4I after forming the patterned second photoresist layer 270P including openings 272 over the patterned absorber layer 230P, the magnetic layer 240, and the capping layer 220, in accordance with some embodiments.

Referring to FIGS. 4J and 4K, the openings 272 in the patterned second photoresist layer 270P expose portions of the patterned absorber layer 230P where the trenches 254 in the EUV mask 200 are to be formed. In some embodiments and as shown in FIG. 4J, the opening location is selected such that the opening 272 expose portions of the patterned absorber layer 230P at the periphery of the patterned absorber layer 230P. In some other embodiments and as shown in FIG. 4K, the opening location is selected such that the openings 272 expose portions of both of the patterned absorber layer 230P and the magnetic layer 240.

To form the patterned second photoresist layer 270P, a second photoresist layer (not shown) is applied over the exposed surfaces of the patterned absorber layer 230P, the magnetic layer 240, and the capping layer 220. The second photoresist layer fills the openings 252 in the patterned absorber layer 230P. In some embodiments, the second photoresist layer includes a positive-tone photoresist material, a negative-tone photoresist material or a hybrid-tone photoresist material. In some embodiments, the second photoresist layer includes a same material as the first photoresist layer 260 described above in FIG. 4F. In some embodiments, the second photoresist layer includes a different material from the first photoresist layer 260. In some embodiments, the second photoresist layer is formed, for example, by spin coating. The second photoresist layer is subsequently patterned by exposing the second photoresist layer to a pattern of radiation, and removing the exposed or unexposed portions of the second photoresist layer using a resist developer depending on whether a positive or negative resist is used. The remaining portions of the photoresist layer constitute the patterned second photoresist layer 270P.

Figure 4L:
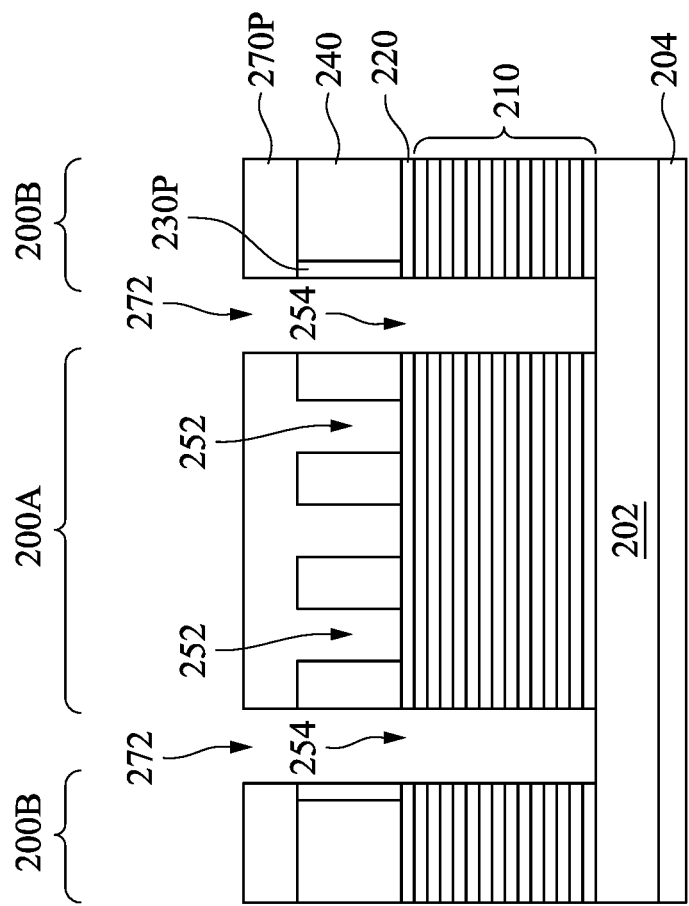
FIG. 4L is a cross-sectional view of the structure of FIG. 4J after etching the patterned absorber layer, the capping layer and the reflective multilayer stack to form trenches, in accordance with some embodiments.
Figure 4M:
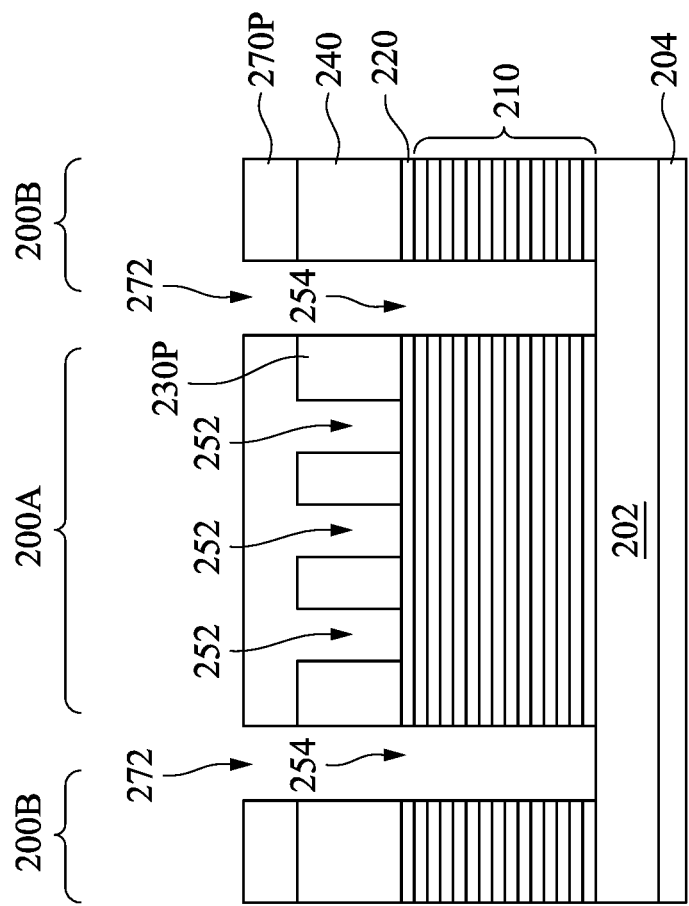
FIG. 4M is a cross-sectional view of the structure of FIG. 4K after etching the patterned absorber layer, the capping layer and the reflective multilayer stack to form trenches, in accordance with some embodiments.

At operation 322 of the method 300, the patterned absorber layer 230P, the capping layer 220, and the reflective multilayer stack 210 are etched using the patterned second photoresist layer 270P as an etch mask to form trenches 254, in accordance with some embodiments. FIG. 4L is a cross-sectional view of the structure of FIG. 4J after etching the patterned absorber layer 230P, the capping layer 220, and the reflective multilayer stack 210 to form the trenches 254, in accordance with some embodiments. FIG. 4M is a cross-sectional view of the structure of FIG. 4K after etching the patterned absorber layer 230P, the capping layer 220, and the reflective multilayer stack 210 to form the trenches 254, in accordance with some embodiments.

Referring to FIGS. 4L and 4M, the trenches 254 extend through the patterned absorber layer 230P, the capping layer 220, and the reflective multilayer stack 210 to expose the surface of the substrate 202. The trenches 254 surround the pattern region 200A of the EUV mask 200, separating the pattern region 200A from the border region 200B.

In some embodiments, the patterned absorber layer 230P, the capping layer 220, and the reflective multilayer stack 210 are etched using a single anisotropic etching process. The anisotropic etch can be a dry etch such as, for example, RIE, a wet etch, or a combination thereof that removes materials of the respective patterned absorber layer 230P, the capping layer 220, and the reflective multilayer stack 210 selective to the material providing the substrate 202. In some embodiments, the patterned absorber layer 230P, the capping layer 220, and the reflective multilayer stack 210 are etched using multiple distinct anisotropic etching processes. Each anisotropic etch can be a dry etch such as, for example, RIE, a wet etch, or a combination thereof. In some embodiments, the etching also removes the portions of the magnetic layer 240 exposed by the openings 272 such that the trenches 254 also extend through the magnetic layer 240.

If not completely consumed during the etching of the patterned absorber layer 230P, the capping layer 220, and the reflective multilayer stack 210, after etching, the patterned second photoresist layer 270P is removed from the surfaces of the magnetic layer 240, the patterned absorber layer 230P, and the capping layer 220, for example, using wet stripping or plasma ashing, thereby providing the EUV mask 200 (FIGS. 2A and 2B).

After removal of the patterned second photoresist layer 270P, the EUV mask 200 is cleaned to remove any contaminants therefrom. In some embodiments, the EUV mask 200 is cleaned by submerging the EUV mask 200 into an ammonium hydroxide ($NH_4OH$) solution. In some embodiments, the EUV mask 200 is cleaned by submerging the EUV mask 200 into a diluted hydrofluoric acid (HF) solution.

The EUV mask 200 is subsequently radiated with, for example, an UV light with a wavelength of 193 nm, for inspection of any defects in the patterned region 200A. The foreign matters may be detected from diffusely reflected light. If contaminants are detected, the EUV mask 200 is further cleaned using suitable cleaning processes.

Figure 5A:
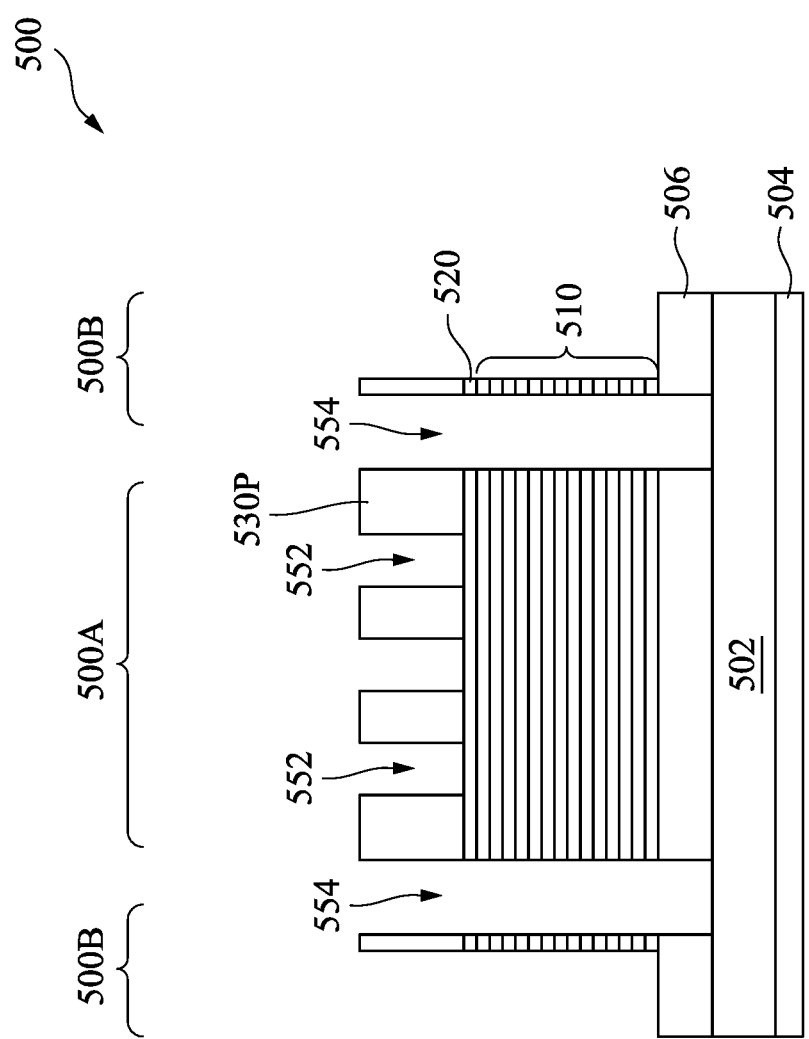
FIG. 5A is a cross-sectional view of a second exemplary EUV mask, in accordance with some embodiment.
Figure 5B:
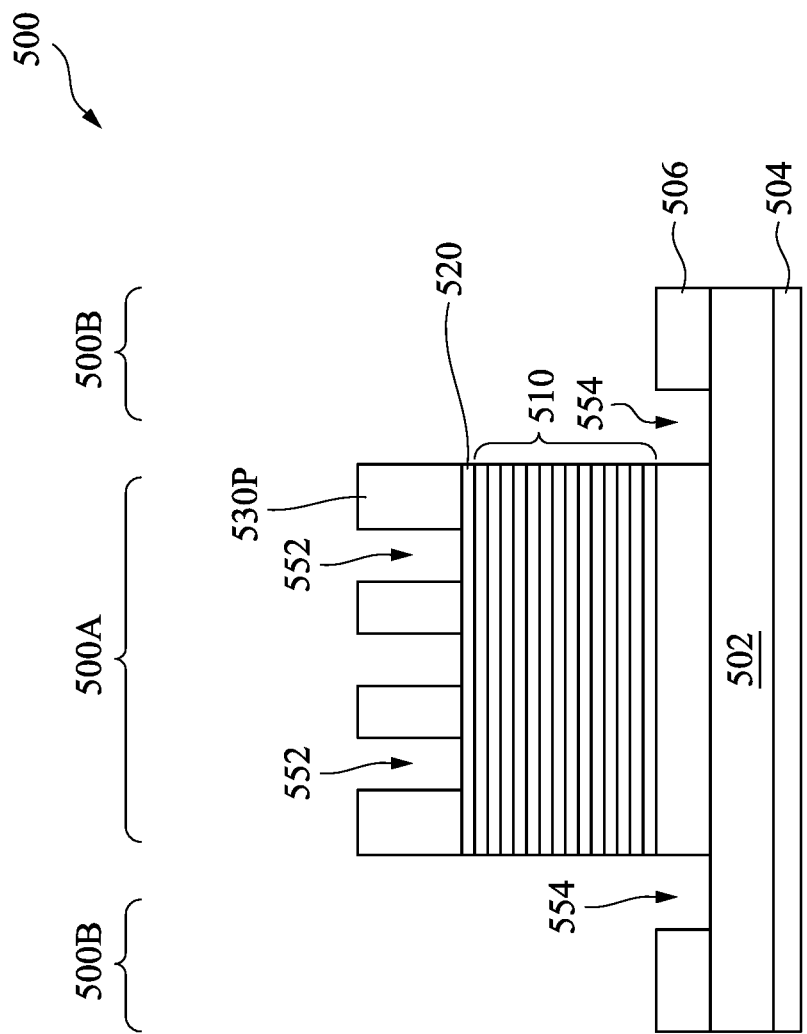
FIG. 5B is a cross-sectional view of a second exemplary EUV mask, in accordance with some alternative embodiments.

FIG. 5A is a cross-sectional view of a second exemplary EUV mask 500, in accordance with some embodiments of the present disclosure. FIG. 5B is a cross-sectional view of a second exemplary EUV mask 500, in accordance with some alternative embodiments of the present disclosure.

Referring to FIGS. 5A and 5B, the EUV mask 500 includes a substrate 502, a magnetic layer 506 over a front surface of the substrate 502, and a mask material stack over a portion of the magnetic layer 506. The mask material stack includes, from bottom to top, a reflective multilayer stack 510, a capping layer 520, and a patterned absorber layer 530P. The EUV mask 500 further includes a conductive layer 504 over a back surface of the substrate 502 opposite the front surface.

The patterned absorber layer 530P contain a pattern of openings 552 that correspond to circuit patterns to be formed on a semiconductor wafer. The pattern of openings 552 is located in a pattern region 500A of the EUV mask 500, exposing a surface of the capping layer 520. The pattern region 500A is surrounded by a border region 500B of the EUV mask 500. The border region 500B corresponds to a non-patterned region of the EUV mask 500 that is not used in an exposing process during IC fabrication. In some embodiments, the pattern region 500A of EUV mask 500 is located at a central region of the substrate 502, and the border region 500B is located at a peripheral portion of the substrate 502. The pattern region 500A is separated from the border region 500B by trenches 554. The trenches 554 extend through the patterned absorber layer 530P, the capping layer 520, the reflective multilayer stack 510, and the magnetic layer 506, exposing the front surfaced of the substrate 202. In some embodiments and as shown in FIG. 5A, the trenches 554 divide the mask material stack (510, 520, 530P) into two portions. Accordingly, a first portion of the mask material stack (510, 520, 530P) is located in the pattern region 500A of the EUV mask 500, while a second portion of the mask material stack (510, 520, 530P) and a peripheral portion of the magnetic layer 506 that is not covered by the mask material stack (510, 520, 530P) are located in the border region 500B of the EUV mask 500. In some other embodiments and as shown in FIG. 5B, an entirety of the mask material stack (510, 520, 530P) is located in the pattern region 500A of the EUV mask 500, while the peripheral portion of the magnetic layer 506 that is not covered by the mask material stack (510, 520, 530P) is located in the border region 500B of the EUV mask 500.

During the EUV lithography, the exposed portion of magnetic layer 506 in the border region 500B of the EUV mask 500 attracts and holds the contamination particles thereon. As a result, the contamination particles in the EUV scanner 100 (FIG. 1) that may otherwise attached to the pattern region 500A of the EUV mask 500 can be deflected away by the exposed portion of the magnetic layer 506 not covered by the mask material stack (510, 520, 530P). Introducing the magnetic layer 506 thereby helps to prevent the contamination particles from becoming attached to the pattern region 500A of the EUV mask 500, which in turn helps to improve the fidelity of lithographically transferred pattern and reduce the patterning errors.

Figure 6:
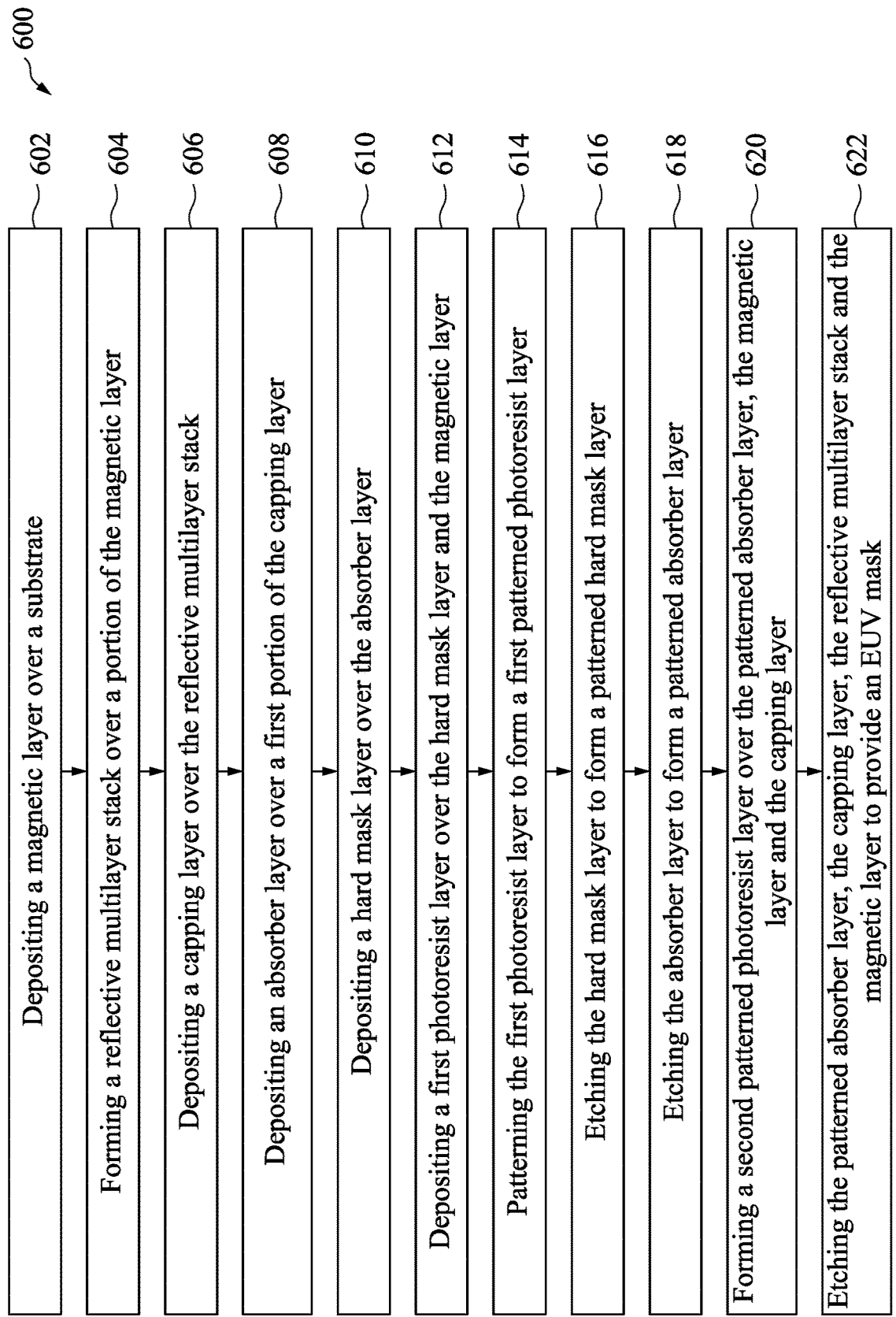
FIG. 6 is a flowchart of a method for fabricating the second exemplary EUV mask, in accordance with some embodiments.

FIG. 6 is a flowchart of a method 600 for fabricating an EUV mask, for example, EUV mask 500, in accordance with some embodiments. FIG. 7A through FIG. 7M are various views of the EUV mask 500 at various stages of the fabrication process, in accordance with some embodiments. The method 600 is discussed in detail below, with reference to the EUV mask 500. In some embodiments, additional operations are performed before, during, and/or after the method 600, or some of the operations described are replaced and/or eliminated. In some embodiments, some of the features described below are replaced or eliminated. One of ordinary skill in the art would understand that although some embodiments are discussed with operations performed in a particular order, these operations may be performed in another logical order.

Figure 7A:
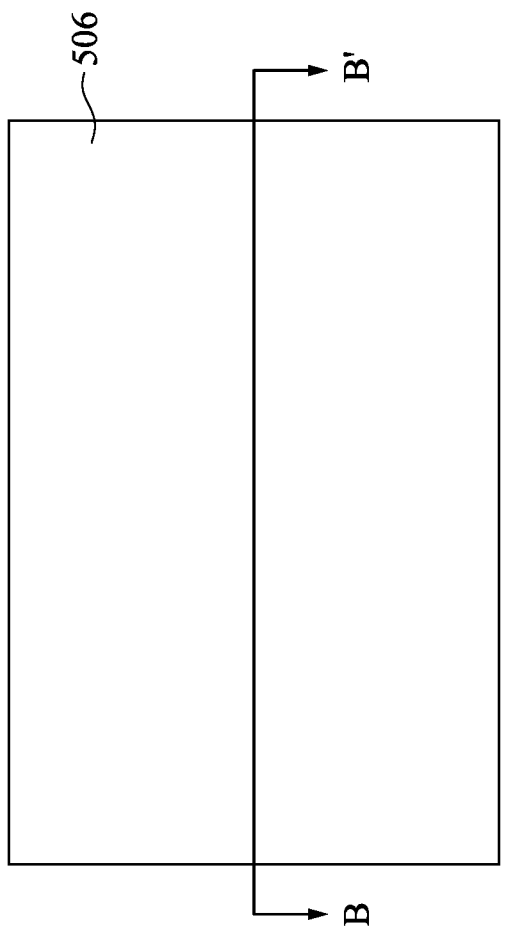
FIG. 7A is a top view of an initial structure of the EUV mask after depositing a magnetic layer over a substrate, in accordance with some embodiments.
Figure 7A:
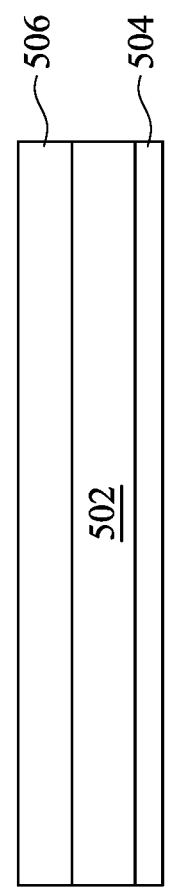

Referring to FIG. 6, the method 600 includes operation 602, in which a magnetic layer 506 is deposited over a substrate 502, in accordance with some embodiments. FIG. 7A is a top view of an initial structure of the EUV mask 500 after depositing the magnetic layer 506 over the substrate 502, in accordance with some embodiments. FIG. 7A' is a cross-sectional view of the structure of FIG. 7A along line B-B'.

Referring to FIGS. 7A and 7A', the initial structure of the EUV mask 500 includes a substrate 502 made of a low thermal expansion material as described above with the substrate 202 in FIGS. 4A and 4A'. In some embodiments, the substrate 502 includes fused silica, fused quartz, calcium fluoride, silicon carbide, black diamond, or titanium oxide doped silicon oxide ($SiO_2/TiO_2$).

In some embodiments, a conductive layer 504 is disposed on a back surface of the substrate 502. In some embodiments, the conductive layer 504 is in direct contact with the back surface of the substrate 502. The conductive layer 504 provides a conductive plane to allow the EUV mask 500 (FIGS. 5A and 5B) to be electrostatically clamped to a mask stage during fabrication and use of the EUV mask 500. In some embodiments, the conductive layer 504 includes CrN or TaB. In some embodiments, the conductive layer 504 is formed by a deposition process such as, for example, CVD, PECVD, or PVD. The thickness of the conductive layer 504 is controlled such that the conductive layer 504 is optically transparent.

The magnetic layer 506 is disposed in direct contact with a front surface of the substrate 502 opposite the back surface. In some embodiments, the magnetic layer 506 includes a magnetic material having a sufficient magnetic strength capable of attracting magnetic particles during EUV lithography. In some embodiments, the magnetic layer 506 includes Fe, Ni, Co, or alloys thereof such as CoFe, FeNi, or CoFeNi. In some embodiments, the magnetic layer 506 is formed by a deposition process such as, for example, CVD, PECVD, PVD such as DC magnetron sputtering, ion beam deposition, or ALD.

Figure 7B:
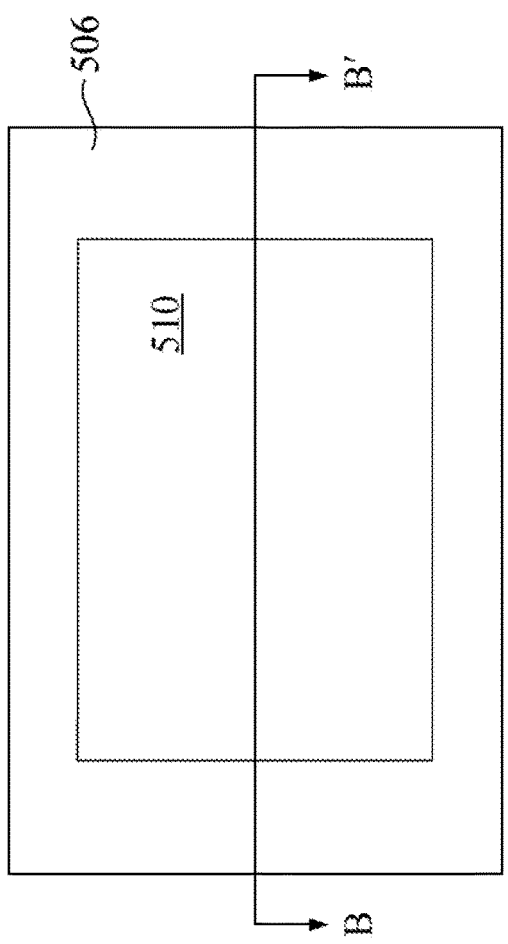
FIG. 7B is a top view of the structure of FIGS. 7A and 7A' after forming a reflective multilayer stack over a portion of the magnetic layer, in accordance with some embodiments.
Figure 7B:
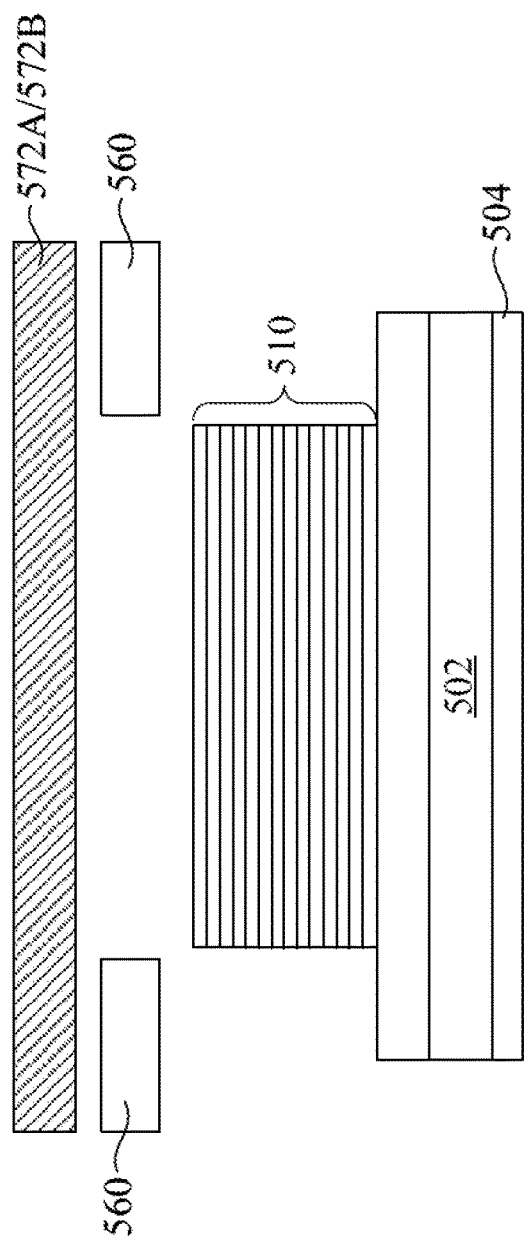

At operation 604 of the method 600, a reflective multilayer stack 510 is formed over a portion of the magnetic layer 506, in accordance with some embodiments. FIG. 7B is a top view of the structure of FIGS. 7A and 7A' after forming the reflective multilayer stack 510 over the portion of the magnetic layer 506, in accordance with some embodiments. FIG. 7B' is a cross-sectional view of the structure of FIG. 7B along line B-B'.

Referring to FIGS. 7B and 7B', the reflective multilayer stack 510 is disposed over a central portion of the magnetic layer 506. The reflective multilayer stack 510 provides a high reflectivity to the EUV light. In some embodiments, the reflective multilayer stack 510 is configured to achieve about 60% to about 75% reflectivity at the peak EUV illumination wavelength, e.g., the EUV illumination at 13.5 nm.

In some embodiments, the reflective multilayer stack 510 includes alternatively stacked layers of a high refractive index material and a low refractive index material. A material having a high refractive index has a tendency to scatter EUV light and on the other hand, a material having a low refractive index has a tendency to transmit EUV light. Pairing these two type materials together provides a resonant reflectivity. In some embodiments, the reflective multilayer stack 510 includes alternatively stacked layers of Mo and Si. In some embodiments, the reflective multilayer stack 510 includes alternatively stacked Mo and Si layers with Si being in the topmost layer. In some embodiments, a molybdenum layer is in direct contact with the magnetic layer 506. In other some embodiments, a silicon layer is in direct contact with the magnetic layer 506. Alternatively, the reflective multilayer stack 510 includes alternatively stacked layers of Mo and Be.

The thickness of each layer in the reflective multilayer stack 510 depends on the EUV wavelength and the incident angle of the EUV light. The thickness of alternating layers in the reflective multilayer stack 510 is tuned to maximize the constructive interference of the EUV light reflected at each interface and to minimize the overall absorption of the EUV light. In some embodiments, the reflective multilayer stack 510 includes from 30 to 60 pairs of alternating layers of Mo and Si. Each Mo/Si pair has a thickness ranging from about 2 nm to about 7 nm, with a total thickness ranging from about 100 nm to about 300 nm.

In some embodiments, each layer in the reflective multilayer stack 510 is deposited over the magnetic layer 506 and underlying layer using ion beam deposition or DC magnetron sputtering. The deposition method used helps to ensure the thickness uniformity of the reflective multilayer stack 510 is better than about 0.85 across the substrate 202. For example, to form a Mo/Si reflective multilayer stack 510, a Mo layer is deposited using a Mo target 572A and then a Si layer is deposited using a Si target 572B. By stacking Si layers and Mo layers in 40 to 50 cycles, each of the cycles comprising the above steps, the Mo/Si reflective multilayer stack is deposited.

During the deposition process, a shielding plate 560 is positioned to shadow the peripheral portion of the magnetic layer 506 so that sputtered atoms are only received by the un-shadowed central portion of the magnetic layer 506. As a result, the reflective multilayer stack 510 is only formed on the central portion of the magnetic layer 506, but not on the peripheral portion of the magnetic layer 506. In some embodiments, the magnetic layer 506 may have a square cross-sectional shape; a length of each side is about 148 cm or 152 cm. In some embodiments, the reflective multilayer stack 510 may also have a square cross-sectional shape; a length of each side is about 138 cm.

Figure 7C:
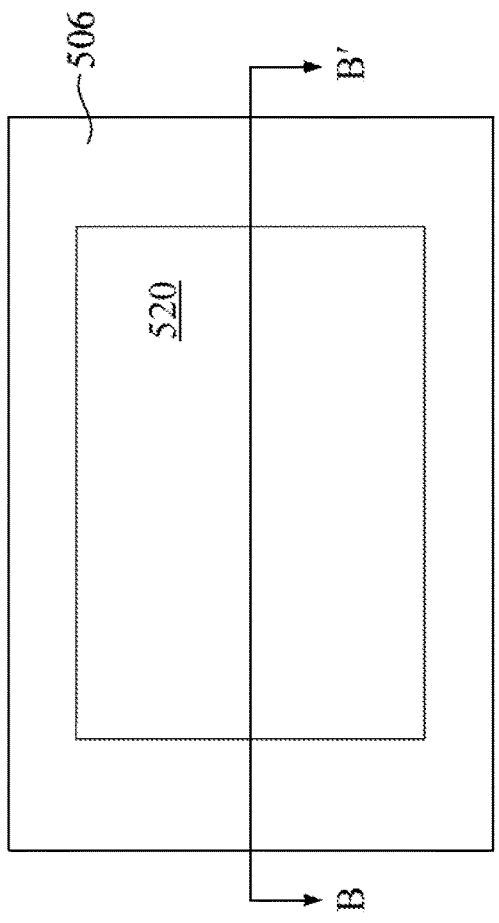
FIG. 7C is a top view of the structure of FIGS. 7B and 7B' after depositing a capping layer over the reflective multilayer stack, in accordance with some embodiments.
Figure 7C:
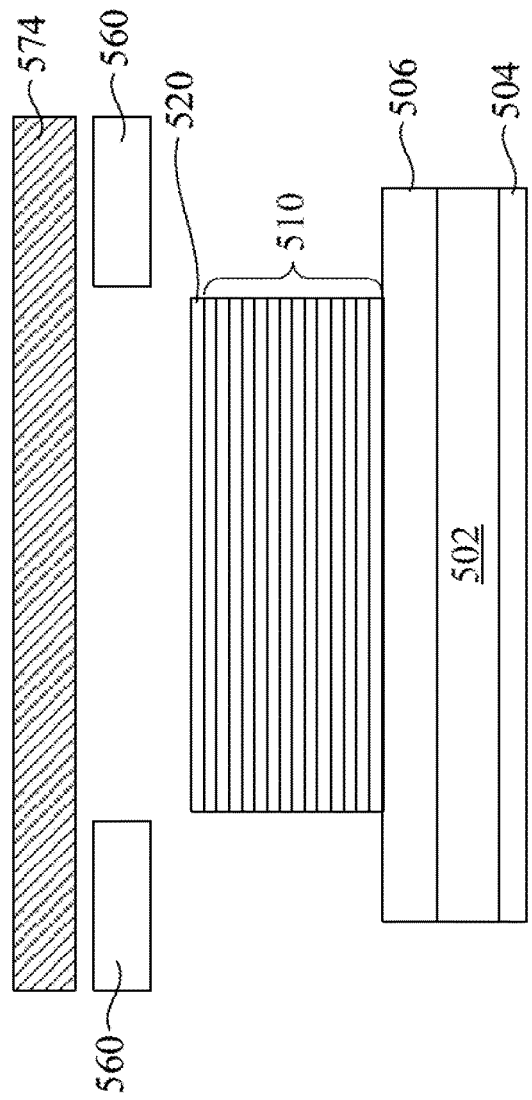

At operation 606 of the method 600, a capping layer 520 is deposited over the reflective multilayer stack 510, in accordance with some embodiments. FIG. 7C is a top view of the structure of FIGS. 7B and 7B' after depositing the capping layer 520 over the reflective multilayer stack 510, in accordance with some embodiments. FIG. 7C' is a cross-sectional view of the structure of FIG. 7C along line B-B'.

Referring to FIGS. 7C and 7C', the capping layer 520 is disposed over the topmost surface of the reflective multilayer stack 510. The capping layer 520 helps to protect the reflective multilayer stack 510 from oxidation and any chemical etchants to which the reflective multilayer stack 510 may be exposed during subsequent mask fabrication processes.

In some embodiments, the capping layer 520 includes a material that resists oxidation and corrosion, and has a low chemical reactivity with common atmospheric gas species such as oxygen, nitrogen, and water vapor. In some embodiments, the capping layer 520 includes Zr, Ru, RuB, RuO, RuNb, or RuNbO.

In some embodiments, the capping layer 520 is formed using a deposition process such as, for example, ion beam deposition, CVD, PVD, or ALD. In instances where a Ru layer is to be formed as the capping layer 520 using ion beam deposition, the deposition may be carried out in an Ar atmosphere by using a Ru target 574 as the sputtering target. During the deposition process, a shielding plate 560 is positioned to shadow the peripheral portion of the magnetic layer 506 so that sputtered atoms are only received by the un-shadowed portion of the reflective multilayer stack 510. As a result, the capping layer 520 is only formed on the reflective multilayer stack 510, but not on the peripheral portion of the magnetic layer 506.

At operation 608 of the method 600, an absorber layer 530 is deposited over the capping layer 520, in accordance with some embodiments. FIG. 7D is a top view of the structure of FIGS. 7C and 7C' after depositing the absorber layer 530 over the capping layer 520, in accordance with some embodiments. FIG. 7D' is a cross-sectional view of the structure of FIG. 7D along line B-B'.

Referring to FIGS. 7D and 7D', the absorber layer 530 is usable to absorb radiation in the EUV wavelength projected onto the EUV mask 500. The absorber layer 530 includes a material having a high absorption coefficient in EUV wavelengths. In some embodiments, the absorber layer 530 includes a material having a high absorption coefficient at 13.5 nm wavelength. In some embodiments, the absorber layer 530 includes Cr, CrO, TiN, TaN, Ta, Ti, Mo, Pd, TaBN, TaBO, $Al_2O_3$, $Ag_2O$, or an alloy such as AlCu or TaPd. In some embodiments, the absorber layer 530 has a single layer structure. In some other embodiments, the absorber layer 530 has a multilayer structure. In some embodiments, the absorber layer 530 is formed by a deposition process such as, for example, CVD, PECVD, PVD such as DC magnetron sputtering, ion beam deposition, or ALD. In some embodiments, the absorber layer 530 is deposited by sputtering a target 576 of absorber material in an argon atmosphere. During the deposition process, a shielding plate 560 is placed between the substrate 502 and the target 576 to shadow the peripheral portion of the magnetic layer 506 so that sputtered atoms are only received by the un-shadowed portion of the capping layer 520. As a result, the absorber layer 530 is only formed on the capping layer 520, but not on the peripheral portion of the magnetic layer 506.

At operation 610 of the method 600, a hard mask layer 540 is deposited over the absorber layer 530, in accordance with some embodiments. FIG. 7E is a top view of the structure of FIGS. 7D and 7D' after depositing the hard mask layer 540 over the absorber layer 530, in accordance with some embodiments. FIG. 7E' is a cross-sectional view of the structure of FIG. 7E along line B-B'.

Referring to FIGS. 7E and 7E', the hard mask layer 540 is disposed directly over the absorber layer 530. In some embodiments, the hard mask layer 540 includes a dielectric oxide such as silicon dioxide or a dielectric nitride such as silicon nitride. In some embodiments, the hard mask layer 540 is formed using a deposition process such as, for example, CVD, PECVD, PVD such as DC magnetron sputtering, ion beam deposition, or ALD. In some embodiments, the hard mask layer 540 is deposited by sputtering a target 578 of hard mask dielectric material in an argon atmosphere. During the deposition process, a shielding plate 560 is placed between the substrate 502 and the target 578 to shadow the peripheral portion of the magnetic layer 506 so that sputtered atoms are only received by the un-shadowed portion of the absorber layer 530. As a result, the hard mask layer 540 is only formed on the absorber layer 530, but not on the peripheral portion of the magnetic layer 506.

Figure 7F:
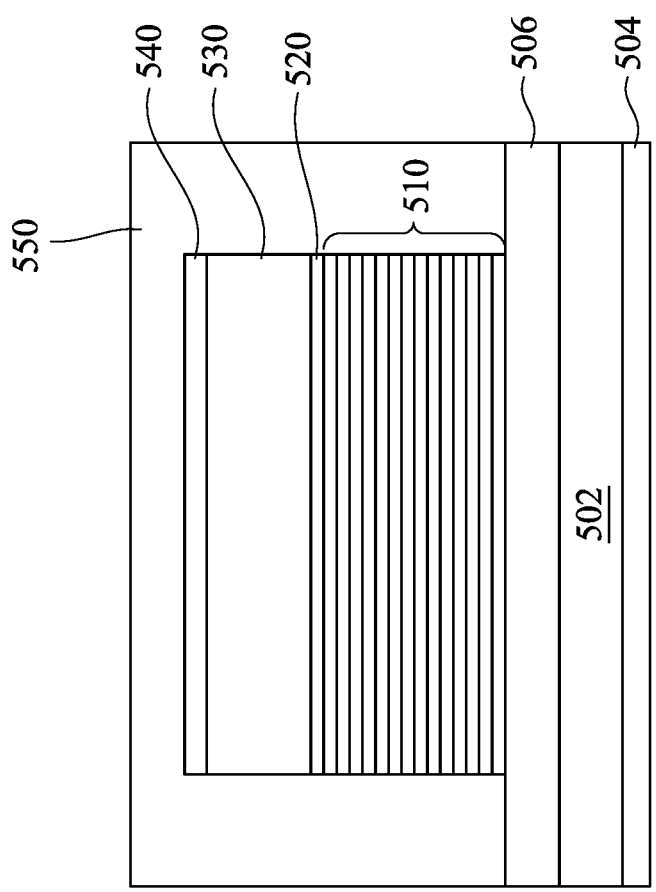
FIG. 7F is a cross-sectional view of the structure of FIGS. 7E and 7E' after applying a first photoresist layer over the hard mask layer, in accordance with some embodiments.

At operation 612 of the method 600, a first photoresist layer 550 is applied over the hard mask layer 540 and the magnetic layer 506, in accordance with some embodiments. FIG. 7F is a cross-sectional view of the structure of FIGS. 7E and 7E' after applying the first photoresist layer 550 over the hard mask layer 540, in accordance with some embodiments.

Referring to FIG. 7F, the first photoresist layer 550 is disposed to the exposed surfaces of the peripheral portion of the magnetic layer 506, the reflective multilayer stack 510, the capping layer 520, the absorber layer 530, and the hard mask layer 540. The first photoresist layer 550 includes a photosensitive material operable to be patterned by radiation. In some embodiments, the first photoresist layer 550 includes a positive-tone photoresist material, a negative-tone photoresist material or a hybrid-tone photoresist material. In some embodiments, the first photoresist layer 550 is applied, for example, by spin coating.

Figure 7G:
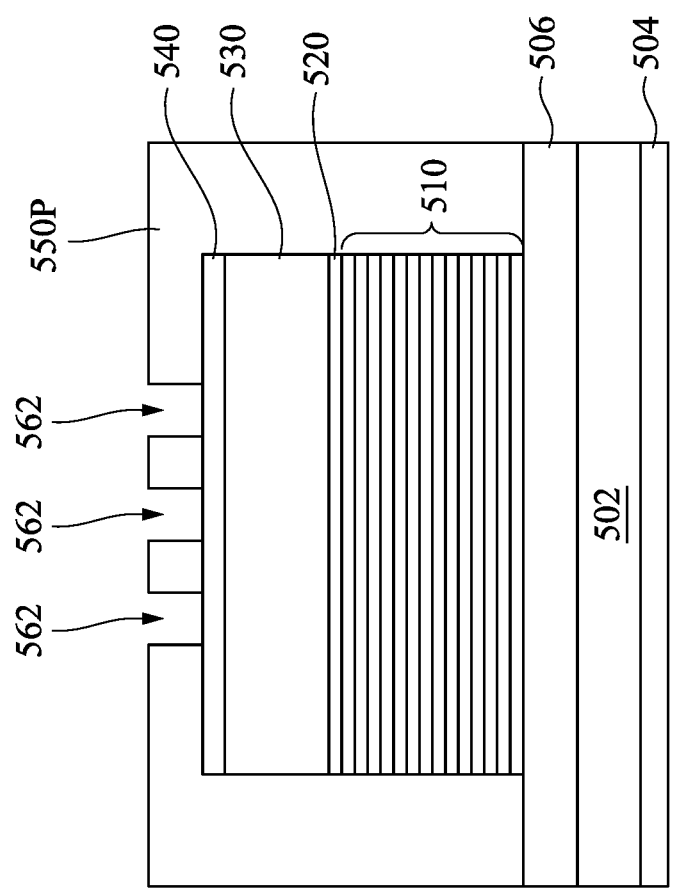
FIG. 7G is a cross-sectional view of the structure of FIG. 7F after lithographically patterning the first photoresist layer to form a patterned first photoresist layer, in accordance with some embodiments.

At operation 614 of the method 600, the first photoresist layer 550 is lithographically patterned to form a patterned first photoresist layer 550P, in accordance with some embodiments. FIG. 7G is a cross-sectional view of the structure of FIG. 7F after lithographically patterning the first photoresist layer 550 to form the patterned first photoresist layer 550P, in accordance with some embodiments.

Referring to FIG. 7G, the first photoresist layer 550 is patterned by subjecting the first photoresist layer 550 to a pattern of irradiation. Next, the exposed or unexposed portions of the first photoresist layer 550 are removed depending on whether a positive-tone or negative-tone resist is used in the first photoresist layer 550 with a resist developer, thereby forming the patterned first photoresist layer 550P having a pattern of openings 562 formed therein. The openings 562 expose portions of the hard mask layer 540. The openings 562 are located in the pattern region 200A and correspond to locations where openings 552 are present in the EUV mask 500 (FIGS. 5A and 5B).

Figure 7H:
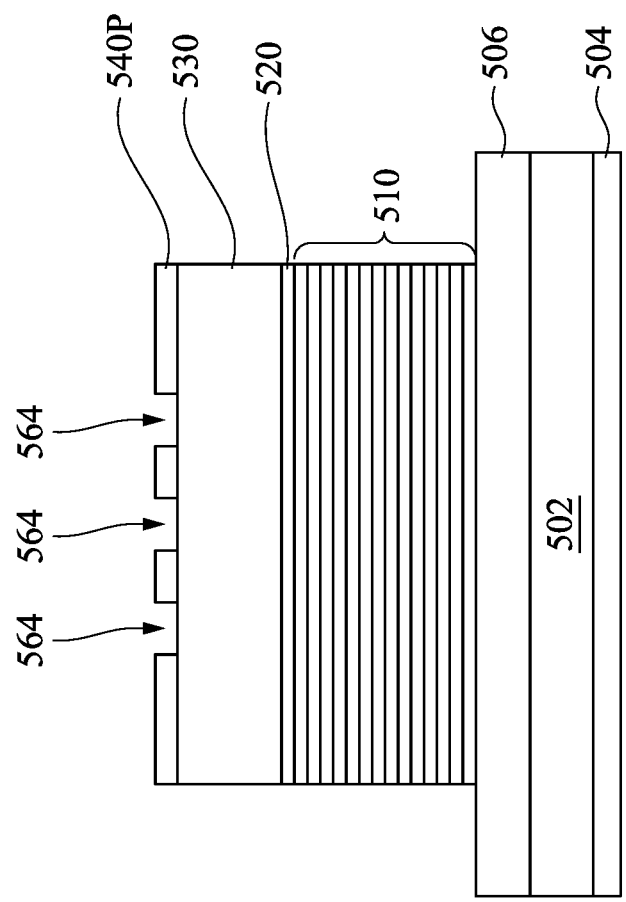
FIG. 7H is a cross-sectional view of the structure of FIG. 7G after etching the hard mask layer to form a patterned hard mask layer, in accordance with some embodiments.

At operation 616 of the method 600, the hard mask layer 540 is etched using the patterned first photoresist layer 550P as an etch mask to form a patterned hard mask layer 540P, in accordance with some embodiments. FIG. 7H is a cross-sectional view of the structure of FIG. 7G after etching the hard mask layer 540 to form the patterned hard mask layer 540P, in accordance with some embodiments.

Referring to FIG. 7H, portions of the hard mask layer 540 that are exposed by the openings 562 in the patterned first photoresist layer 550P are etched to form openings 564. The openings 564 extend through the hard mask layer 540, exposing portions of the underlying absorber layer 530. In some embodiments, the hard mask layer 540 is etched using an anisotropic etch. In some embodiments, the anisotropic etch is a dry etch such as, for example, RIE, a wet etch, or a combination thereof. The etch removes the material providing the hard mask layer 540 selective to the material providing the absorber layer 530. The remaining portions of the hard mask layer 540 constitute the patterned hard mask layer 540P. If not completely consumed during the etching of the hard mask layer 540, after etching the hard mask layer 540, the patterned first photoresist layer 550P is removed from the structure, for example, using wet stripping or plasma ashing.

Figure 7I:
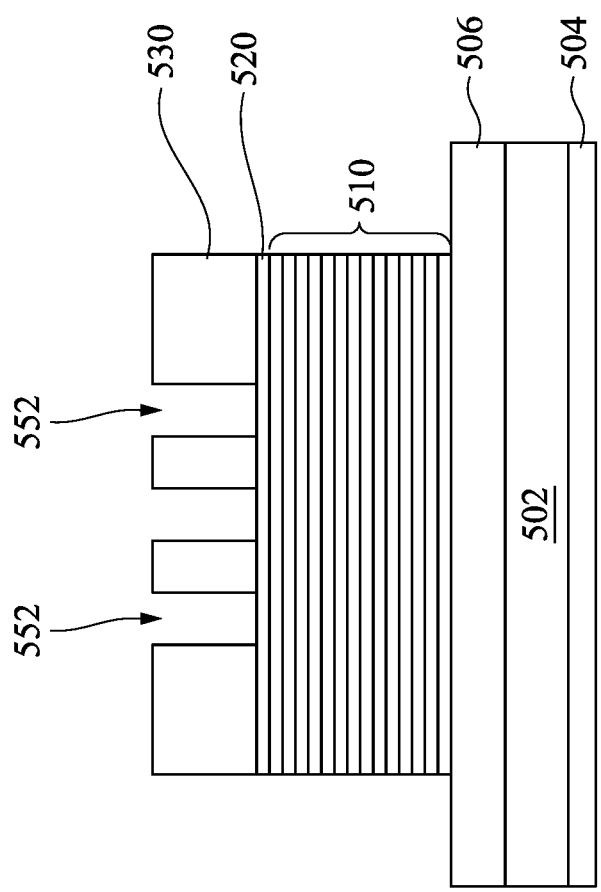
FIG. 7I is a cross-sectional view of the structure of FIG. 7G after etching the absorber layer to form a patterned absorber layer, in accordance with some embodiments.

At operation 618 of the method 600, the absorber layer 530 is etched using the patterned hard mask layer 540P as an etch mask to form a patterned absorber layer 530P, in accordance with some embodiments. FIG. 7I is a cross-sectional view of the structure of FIG. 7G after etching the absorber layer 530 to form the patterned absorber layer 530P, in accordance with some embodiments.

Referring to FIG. 7I, portions of the absorber layer 530 that are exposed by the openings 564 in the patterned hard mask layer 540P are etched to form openings 552. The openings 552 extend through the absorber layer 530, exposing portions of the underlying capping layer 520. In some embodiments, the absorber layer 530 is etched using an anisotropic etching process. In some embodiments, the anisotropic etch is a dry etch such as, for example, RIE, a wet etch, or a combination thereof that removes the material providing the absorber layer 530 selective to the material providing the capping layer 520. For example, in some embodiments, the absorber layer 530 is dry etched with a gas that contains chlorine, such as $Cl_2$ or $BCl_3$, or with a gas that contains fluorine, such as $NF_3$. Ar may be used as a carrier gas. In some embodiments, oxygen may also be included as the carrier gas. The etch rate and the etch selectivity depend on the etchant gas, etchant flow rate, power, pressure, and substrate temperature. After etching, the patterned hard mask layer 540P is removed, for example, by oxygen plasma. The remaining portions of the absorber layer 530 constitute the patterned absorber layer 530P.

Figure 7J:
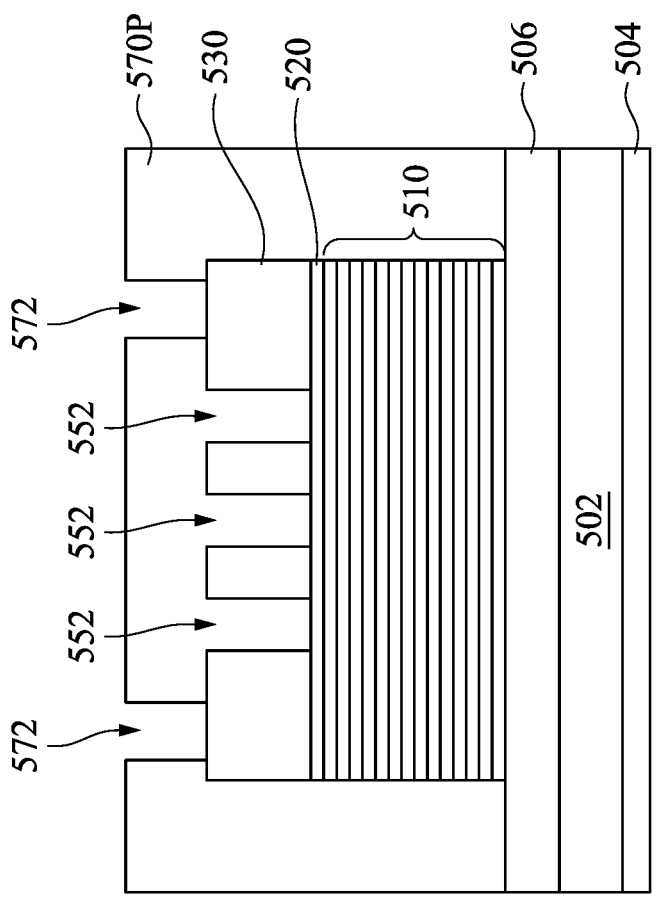
FIG. 7J is a cross-sectional view of the structure of FIG. 7I after forming a patterned second photoresist layer including openings over exposed surfaces of the peripheral portion of the magnetic layer, the reflective multilayer stack, the capping layer and the patterned absorber layer, in accordance with some embodiments.
Figure 7K:
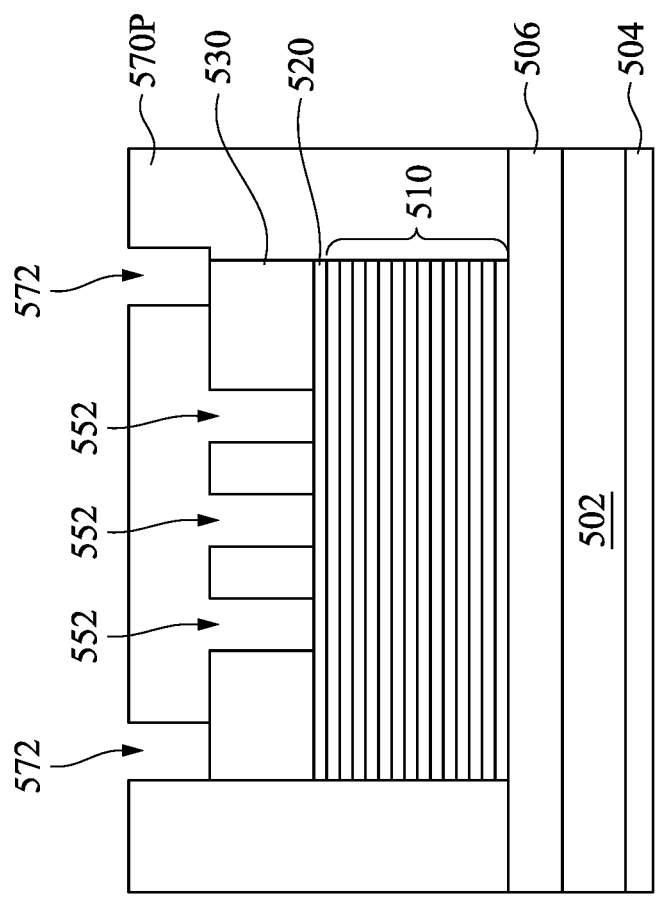
FIG. 7K is a cross-sectional view of the structure of FIG. 7I after forming a patterned second photoresist layer including openings over exposed surfaces of the peripheral portion of the magnetic layer, the reflective multilayer stack, the capping layer and the patterned absorber layer, in accordance with some other embodiments.

At operation 620 of the method 600, a patterned second photoresist layer 570P including a pattern of openings 572 is formed over exposed surfaces of the peripheral portion of the magnetic layer 506, the reflective multilayer stack 510, the capping layer 520, and the patterned absorber layer 530P, in accordance with some embodiments. FIGS. 7J and 7K are cross-sectional views of the structure of FIG. 7I after forming the patterned second photoresist layer 570P including openings 572 over the exposed surfaces of the peripheral portion of the magnetic layer 506, the reflective multilayer stack 510, the capping layer 520, and the patterned absorber layer 530P, in accordance with some embodiments.

Referring to FIGS. 7J and 7K, the openings 272 in the patterned second photoresist layer 570P expose portions of the patterned absorber layer 530P where the trenches 554 in the EUV mask 500 (FIGS. 5A and 5B) are to be formed. In some embodiments and as shown in FIG. 7J, the opening location is selected such that the opening 572 expose portions of the patterned absorber layer 530P at the periphery of the patterned absorber layer 530P. In some other embodiments and as shown in FIG. 7K, the opening location is selected such that the openings 572 expose portions of both of the patterned absorber layer 530P and the peripheral portion of the magnetic layer 506.

To form the patterned second photoresist layer 570P, a second photoresist layer (not shown) is applied over the patterned absorber layer 530P, the capping layer 520, and the peripheral portion of the magnetic layer 506. The second photoresist layer fills the openings 552 in the patterned absorber layer 530P. In some embodiments, the second photoresist layer includes a positive-tone photoresist material, a negative-tone photoresist material or a hybrid-tone photoresist material. In some embodiments, the second photoresist layer includes a same material as the first photoresist layer 550 described above in FIG. 7F. In some embodiments, the second photoresist layer includes a different material from the first photoresist layer 550. In some embodiments, the second photoresist layer is formed, for example, by spin coating. The second photoresist layer is subsequently patterned by exposing the second photoresist layer to a pattern of radiation, and removing the exposed or unexposed portions of the second photoresist layer using a resist developer depending on whether a positive or negative resist is used. The remaining portions of the photoresist layer constitute the patterned second photoresist layer 570P.

Figure 7L:
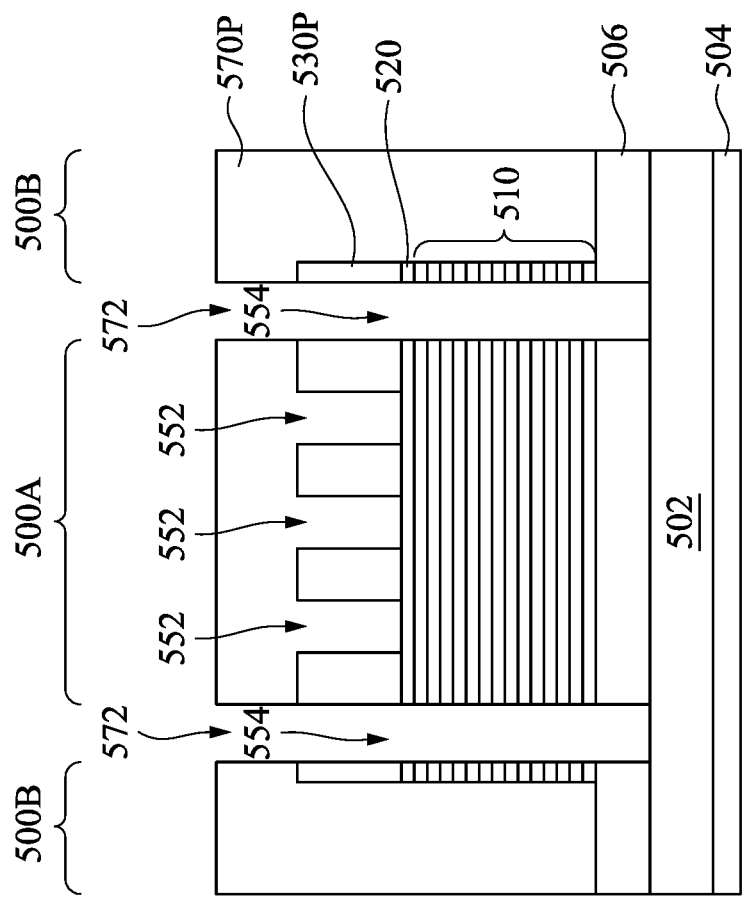
FIG. 7L is a cross-sectional view of the structure of FIG. 7J after etching the patterned absorber layer, the capping layer, the reflective multilayer stack and the magnetic layer to form trenches, in accordance with some embodiments.
Figure 7M:
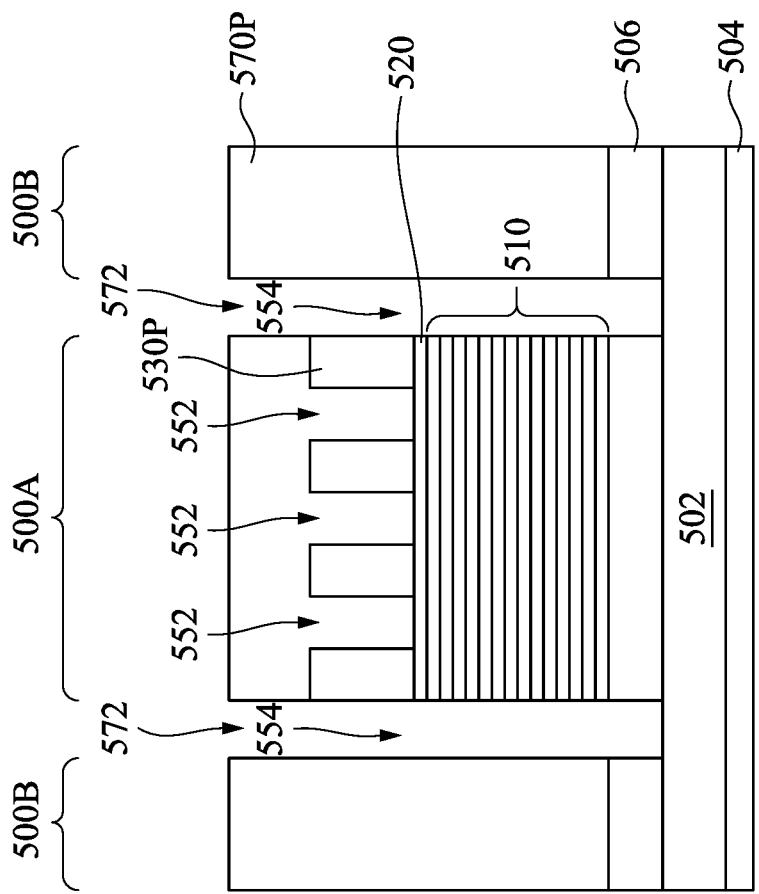
FIG. 7M is a cross-sectional view of the structure of FIG. 7K after etching the patterned absorber layer, the capping layer, the reflective multilayer stack, and the magnetic layer to form trenches, in accordance with some embodiments.

At operation 622 of the method 600, the patterned absorber layer 530P, the capping layer 520, the reflective multilayer stack 510, and the magnetic layer 506 are etched using the patterned second photoresist layer 570P as an etch mask to form trenches 554, in accordance with some embodiments. FIG. 7L is a cross-sectional view of the structure of FIG. 7J after etching the patterned absorber layer 530P, the capping layer 520, the reflective multilayer stack 510, and the magnetic layer 506 to form the trenches 254, in accordance with some embodiments. FIG. 7M is a cross-sectional view of the structure of FIG. 7K after etching the patterned absorber layer 530P, the capping layer 520, the reflective multilayer stack 510, and the magnetic layer 506 to form the trenches 254, in accordance with some embodiments.

Referring to FIGS. 7L and 7M, the trenches 554 extend through the patterned absorber layer 530P, the capping layer 520, the reflective multilayer stack 510, and the magnetic layer 506 to expose the surface of the substrate 502. The trenches 554 surround the pattern region 500A of the EUV mask 500, separating the pattern region 500A from the border region 500B.

In some embodiments, the patterned absorber layer 530P, the capping layer 520, the reflective multilayer stack 510, and the magnetic layer 506 are etched using a single anisotropic etching process. The anisotropic etch can be a dry etch such as, for example, RIE, a wet etch, or a combination thereof that removes materials of the respective the patterned absorber layer 530P, the capping layer 520, the reflective multilayer stack 510, and the magnetic layer 506 selective to the material providing the substrate 502. In some embodiments, the patterned absorber layer 530P, the capping layer 520, the reflective multilayer stack 510, and the magnetic layer 506 are etched using multiple distinct anisotropic etching processes. Each anisotropic etch can be a dry etch such as, for example, RIE, a wet etch, or a combination thereof.

If not completely consumed during the etching of the patterned absorber layer 530P, the capping layer 520, the reflective multilayer stack 510, and the magnetic layer 506, after etching, the patterned second photoresist layer 570P is removed from the surfaces of the patterned absorber layer 530P, the capping layer 220, and the magnetic layer 506 for example, using wet stripping or plasma ashing, thereby providing the EUV mask 500 (FIGS. 5A and 5B).

After removal of the patterned second photoresist layer 570P, the EUV mask 500 is cleaned to remove any contaminants therefrom. In some embodiments, the EUV mask 500 is cleaned by submerging the EUV mask 500 into an $NH_4OH$ solution. In some embodiments, the EUV mask 500 is cleaned by submerging the EUV mask 500 into a diluted HF solution.

The EUV mask 500 is subsequently radiated with, for example, an UV light with a wavelength of 193 nm, for inspection of any defects in the patterned region 500A. The foreign matters may be detected from diffusely reflected light. If contaminants are detected, the EUV mask 500 is further cleaned using suitable cleaning processes.

One aspect of this description relates to an EUV mask including a pattern region and a border region. The EUV mask includes a substrate, a reflective multilayer stack over the substrate, a capping layer over the reflective multilayer stack, a patterned absorber layer over a first portion of the capping layer, and a magnetic layer over a second portion of the capping layer around the first portion.

Another aspect of this description relates to relates to a method of forming an EUV mask. The method includes forming a reflective multilayer stack over a substrate, depositing a capping layer over the reflective multilayer stack, depositing an absorber layer over a first portion of the capping layer, depositing a magnetic layer over a second portion of the capping layer around the first portion, and etching the absorber layer to form a plurality of openings therein. The plurality of openings expose a surface of the capping layer.

Still another aspect of this description relates to a method of forming an EUV mask. The method includes depositing a magnetic layer over a first side of a substrate, forming a reflective multilayer stack over a portion the magnetic layer, wherein a peripheral portion of the magnetic layer is exposed, depositing a capping layer over the reflective multilayer stack, depositing an absorber layer over the capping layer, and etching the absorber layer to form a patterned absorber layer comprising a plurality of openings therein, the plurality of openings exposing a surface of the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an extreme ultraviolet (EUV) mask, comprising:
    forming a reflective multilayer stack over a substrate;
    depositing a capping layer over the reflective multilayer stack;
    depositing an absorber layer over a first portion of the capping layer;
    depositing a magnetic layer over a second portion of the capping layer around the first portion, the magnetic layer contacting sidewalls of the absorber layer and having a top surface coplanar with a top surface of the absorber layer; and
    etching the absorber layer to form a patterned absorber layer comprising a plurality of openings therein, the plurality of openings exposing a surface of the capping layer,
    wherein the magnetic layer contacts outermost sidewalls of the patterned absorber layer.

2. The method of claim 1, wherein depositing the absorber layer comprises:
    placing a shielding plate between the substrate and a first target comprising an absorber material, wherein the shielding plate shadows the second portion, and the first portion of the capping layer is un-shadowed; and
    sputtering the first target in an argon atmosphere to deposit the absorber layer over the first portion of the capping layer.

3. The method of claim 1, wherein depositing the magnetic layer comprises:
    placing a shielding plate between the substrate and a second target comprising a magnetic material, wherein the shielding plate shadows the first portion, while the second portion of the capping layer is un-shadowed; and
    sputtering the second target in an argon atmosphere to deposit the magnetic layer over the second portion of the capping layer.

4. The method of claim 1, wherein the magnetic layer comprises iron, nickel, cobalt, combinations thereof or alloys thereof.

5. The method of claim 1, further comprising depositing a hard mask layer over the absorber layer and the magnetic layer.

6. The method of claim 5, wherein etching the absorber layer comprises:
    depositing a photoresist layer over the hard mask layer;
    patterning the photoresist layer to form a patterned photoresist layer comprising openings;
    etching the hard mask layer to form a patterned hard mask layer using the patterned photoresist layer as an etch mask; and
    etching the absorber layer to form the plurality of openings therein using the patterned hard mask layer as an etch mask.

7. A method of forming an extreme ultraviolet (EUV) mask, comprising:
    forming a capping layer over a reflective multilayer stack on a substrate;
    depositing an absorber layer over a first portion of the capping layer;
    depositing a magnetic layer over a second portion of the capping layer around the first portion, the magnetic layer laterally surrounding and contacting sidewalls of the absorber layer, wherein the magnetic layer includes a magnetic material selected from Fe, Ni, Co, CoFe and CoFeNi;
    forming a hard mask layer over the absorber layer and the magnetic layer;
    etching the hard mask layer to form a patterned hard mask layer, the patterned hard mask layer comprising a plurality of first openings exposing a surface of the absorber layer; and etching the absorber layer using the patterned hard mask layer as an etch mask to form a patterned absorber layer, the patterned absorber layer comprising a plurality of second openings exposing a surface of the capping layer, wherein the plurality of second openings corresponds to circuit patterns to be formed in a semiconductor wafer, wherein the absorber layer comprises a non-magnetic material.

8. The method of claim 7, wherein the absorber layer comprises chromium (Cr), chromium oxide (CrO), titanium nitride (TiN), tantalum nitride (TaN), tantalum (Ta), titanium (Ti), Mo, aluminum copper (AlCu), palladium (Pd), tantalum boron nitride (TaBN), aluminum oxide ($Al_2O_3$) or silver oxide ($Ag_2O$).

9. The method of claim 7, wherein the reflective multilayer stack comprises alternately stacked Mo and Si layers with Si being in the topmost layer.

10. The method of claim 7, further comprising removing the patterned hard mask layer after forming the patterned absorber layer.

11. The method of claim 10, further comprising forming a trench extending through at least the patterned absorber layer, the capping layer and the reflective multilayer stack, the trench surrounding the plurality of second openings and exposing a surface of the substrate.

12. The method of claim 11, wherein the trench extends through the patterned absorber layer, the magnetic layer, the capping layer and the reflective multilayer stack.

13. The method of claim 11, wherein forming the trench comprises removing portions of the patterned absorber layer, the capping layer and the reflective multilayer stack positioned outside the plurality of second openings in the patterned absorber layer.

14. The method of claim 1, further comprising forming a trench extending through the patterned absorber layer, the capping layer and the reflective multilayer stack, the trench separating a pattern region of the EUV mask from a border region of the EUV mask and dividing the patterning absorber layer into a first portion and a second portion, wherein the first portion of the patterned absorber layer is located in the pattern region of the EUV mask and contains the plurality of openings, and the second portion of the patterned absorber layer is located in the border region of the EUV mask and is in direct contact with the magnetic layer.

15. A method of forming an extreme ultraviolet (EUV) mask, comprising:
    forming a reflective multilayer stack over a first side of a substrate;
    depositing a capping layer over the reflective multilayer stack;
    depositing an absorber material over a central portion of the capping layer while a peripheral portion of the capping layer is shielded by a first shielding plate to form an absorber layer over the central portion of the capping layer;
    depositing a magnetic material over the peripheral portion of the capping layer while the absorber layer is shielded by a second shielding plate to form a magnetic layer abutting sidewalls of the absorber layer;
    forming a patterned photoresist layer over the absorber layer; and
    etching the absorber layer using the patterned photoresist layer as an etch mask to form a patterned absorber layer comprising a plurality of openings therein, the plurality of openings exposing a surface of the capping layer.

16. The method of claim 15, wherein the magnetic layer contacts outermost sidewalls of the patterned absorber layer.

17. The method of claim 15, wherein depositing the magnetic material comprises sputtering a target of the magnetic material in an inert atmosphere.

18. The method of claim 15, wherein the magnetic material comprises iron, nickel, cobalt, combinations thereof or alloys thereof.

19. The method of claim 15, further comprising forming a conductive layer over a second side of the substrate opposite the first side.

20. The method of claim 15, wherein the absorber layer comprises a first stripe extending in a first direction and a second strip extending a second direction traversing the first direction.

* * * * *